(12) United States Patent
Jang et al.

(10) Patent No.: US 12,550,392 B2
(45) Date of Patent: Feb. 10, 2026

(54) SEMICONDUCTOR DEVICES

(71) Applicant: SAMSUNG ELECTRONICS CO., LTD., Suwon-si (KR)

(72) Inventors: Ingyu Jang, Suwon-si (KR); Jinbum Kim, Suwon-si (KR); Sujin Jung, Suwon-si (KR); Gyeom Kim, Gyeonggi-do (KR); Dahye Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 367 days.

(21) Appl. No.: 18/325,412

(22) Filed: May 30, 2023

(65) Prior Publication Data
US 2024/0145542 A1    May 2, 2024

(30) Foreign Application Priority Data
Oct. 27, 2022   (KR) .................... 10-2022-0140027

(51) Int. Cl.
*H10D 62/10*    (2025.01)
*H10D 30/43*    (2025.01)
*H10D 30/67*    (2025.01)
*H10D 64/62*    (2025.01)

(52) U.S. Cl.
CPC .......... *H10D 62/121* (2025.01); *H10D 30/43* (2025.01); *H10D 30/6735* (2025.01); *H10D 30/6757* (2025.01); *H10D 64/62* (2025.01)

(58) Field of Classification Search
CPC ............ H10D 62/121; H10D 30/6757; H10D 30/6735; H10D 64/62; H10D 30/43
See application file for complete search history.

(56) References Cited

U.S. PATENT DOCUMENTS

| | | | |
|---|---|---|---|
| 9,905,846 B2 | 2/2018 | Kwok et al. | |
| 9,922,978 B2 * | 3/2018 | Ching | H10D 64/256 |
| 10,276,675 B2 | 4/2019 | Choi et al. | |
| 10,714,579 B2 | 7/2020 | Lee et al. | |

(Continued)

FOREIGN PATENT DOCUMENTS

| | | |
|---|---|---|
| TW | 202211316 A | 3/2022 |
| TW | 202230685 A | 8/2022 |

OTHER PUBLICATIONS

Office Action dated May 10, 2024 in corresponding Taiwan Patent Application No. 112119828, 3 pages.

(Continued)

*Primary Examiner* — Christine A Enad
(74) *Attorney, Agent, or Firm* — Morgan, Lewis & Bockius LLP

(57) ABSTRACT

A semiconductor device includes an active pattern disposed on a substrate; a gate structure disposed on the active pattern; channels disposed on the substrate and that are spaced apart from each other in a vertical direction substantially perpendicular to an upper surface of the substrate; a first epitaxial layer disposed on a portion of the active pattern adjacent to the gate structure; and a contact plug disposed on the first epitaxial layer. The contact plug includes a lower portion; a middle portion disposed on the lower portion, where the middle portion has a width that increases from a bottom to a top thereof along the vertical direction; and an upper portion disposed on the middle portion.

20 Claims, 38 Drawing Sheets

(56) References Cited

U.S. PATENT DOCUMENTS

| | | | |
|---|---|---|---|
| 10,974,433 B2 | 4/2021 | Campi, Jr. et al. | |
| 11,450,572 B2* | 9/2022 | Chen | H01L 21/76805 |
| 11,631,769 B2 | 4/2023 | Kim et al. | |
| 2017/0148797 A1* | 5/2017 | Kim | H10D 30/024 |
| 2018/0233567 A1 | 8/2018 | Choi et al. | |
| 2021/0366786 A1 | 11/2021 | Chen et al. | |
| 2021/0376101 A1 | 12/2021 | Wang et al. | |
| 2022/0069134 A1 | 3/2022 | Kim et al. | |
| 2022/0102521 A1 | 3/2022 | Dewey et al. | |
| 2022/0165848 A1 | 5/2022 | Lin et al. | |
| 2022/0181439 A1 | 6/2022 | Wu et al. | |
| 2022/0216339 A1 | 7/2022 | Lee et al. | |
| 2022/0336614 A1* | 10/2022 | Wang | H10D 64/017 |

OTHER PUBLICATIONS

Search Report dated May 10, 2024, in corresponding Taiwan Patent Application No. 112119828, 2 pages.

Extended European Search Report dated Apr. 5, 2024 in related European Patent Application No. 23173866.7, 13 pages.

\* cited by examiner

FIG. 7
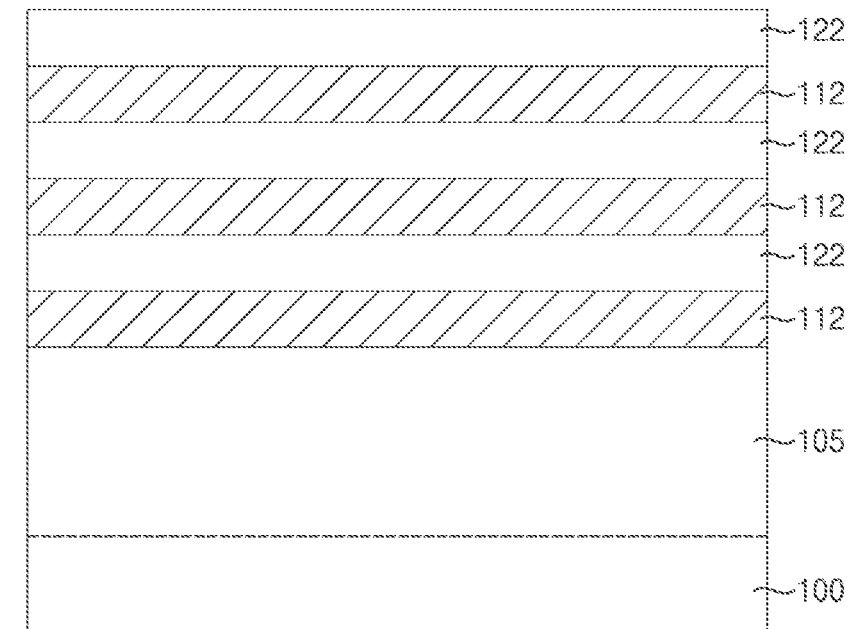
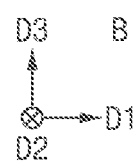

SEMICONDUCTOR DEVICES

CROSS-REFERENCE TO RELATED APPLICATION

This application claims priority under 35 USC § 119 from Korean Patent Application No. 10-2022-0140027, filed on Oct. 27, 2022 in the Korean Intellectual Property Office (KIPO), the contents of which are herein incorporated by reference in their entirety.

TECHNICAL FIELD

Embodiments are directed to semiconductor devices. More particularly, embodiments are directed to semiconductor devices that include a plurality of channels sequentially stacked in a vertical direction.

DISCUSSION OF THE RELATED ART

In a method of manufacturing a semiconductor device that includes a plurality of channels sequentially stacked in a vertical direction, a dummy gate structure and a gate spacer are formed on sacrificial lines and semiconductor lines that are alternately and repeatedly stacked in the vertical direction, an etching process is performed using the dummy gate structure and the gate spacer as an etching mask to etch the semiconductor lines and the sacrificial lines to form semiconductor patterns and sacrificial patterns, respectively, a source/drain layer is formed to contact sidewalls of the semiconductor patterns, an opening is formed through the sacrificial patterns by an etching process, and a gate structure is formed in the opening.

As the integration degree of semiconductor devices increases, the opening may have a reduced diameter, and thus the process for forming the opening becomes more challenging.

SUMMARY

Embodiments provide a semiconductor device that has enhanced characteristics.

According to embodiments, there is provided a semiconductor device. The semiconductor device includes an active pattern disposed on a substrate; a gate structure disposed on the active pattern; channels disposed on the substrate and that are spaced apart from each other in a vertical direction substantially perpendicular to an upper surface of the substrate; a first epitaxial layer disposed on a portion of the active pattern adjacent to the gate structure; and a contact plug disposed on the first epitaxial layer. The contact plug includes a lower portion; a middle portion disposed on the lower portion, where the middle portion has a width that increases from a bottom to a top thereof along the vertical direction; and an upper portion disposed on the middle portion.

According to embodiments, there is provided a semiconductor device. The semiconductor device includes an active pattern disposed on a substrate; a gate structure disposed on the active pattern; channels disposed on the substrate and that are spaced apart from each other in a vertical direction substantially perpendicular to the upper surface of the substrate; a first epitaxial layer disposed on a portion of the active pattern adjacent to the gate structure; and a contact plug. The contact plug includes a lower portion and a middle portion sequentially stacked in the vertical direction, where the lower portion and the middle portion extend through an upper portion of the first epitaxial layer; and an upper portion disposed on the middle portion, where the upper portion extends in the vertical direction; and a second epitaxial layer disposed on the middle portion of the contact plug. The second epitaxial layer contacts a portion of a sidewall of the upper portion of the contact plug.

According to embodiments, there is provided a semiconductor device. The semiconductor device includes an active pattern disposed on a substrate, where the active pattern extends in a first direction that is substantially parallel to an upper surface of the substrate; a gate structure disposed on the active pattern, where the gate structure extends in a second direction that is substantially parallel to the upper surface of the substrate and crosses the first direction; channels disposed on the active pattern and that are spaced apart from each other in a third direction that is substantially perpendicular to the upper surface of the substrate; a first epitaxial layer disposed on a portion of the active pattern adjacent in the first direction to the gate structure, where the first epitaxial layer includes silicon doped with n-type impurities; a contact plug disposed on the first epitaxial layer, where the contact plug includes: a lower portion; a middle portion disposed on the lower portion, where the middle portion hays a width in the first direction that increases from a bottom to a top thereof along the vertical direction; and a upper portion disposed on the middle portion; and a second epitaxial layer disposed on the middle portion of the contact plug. The second epitaxial layer contacts a portion of a sidewall in the first direction of the upper portion of the contact plug and includes one of silicon or silicon doped with p-type impurities.

In a semiconductor device in accordance with embodiments, the contact plug can be formed to contact the first epitaxial layer in a large area by changing minor process conditions.

BRIEF DESCRIPTION OF THE DRAWINGS

FIGS. 5 to 28 are plan views and cross-sectional views that illustrate a method of manufacturing a semiconductor device in accordance with embodiments.

DESCRIPTION OF EMBODIMENTS

A semiconductor device and a method of manufacturing the same in accordance with embodiments will be described more fully hereinafter with reference to the accompanying drawings. Hereinafter in the specifications, but not necessarily in the claims, two horizontal directions substantially parallel to an upper surface of a substrate that cross each other, may be referred to as first and second directions D1 and D2, respectively, and a vertical direction substantially perpendicular to the upper surface of the substrate may be referred to as a third direction D3. In embodiments, the first and second directions D1 and D2 are substantially perpendicular to each other.

Figure 1:
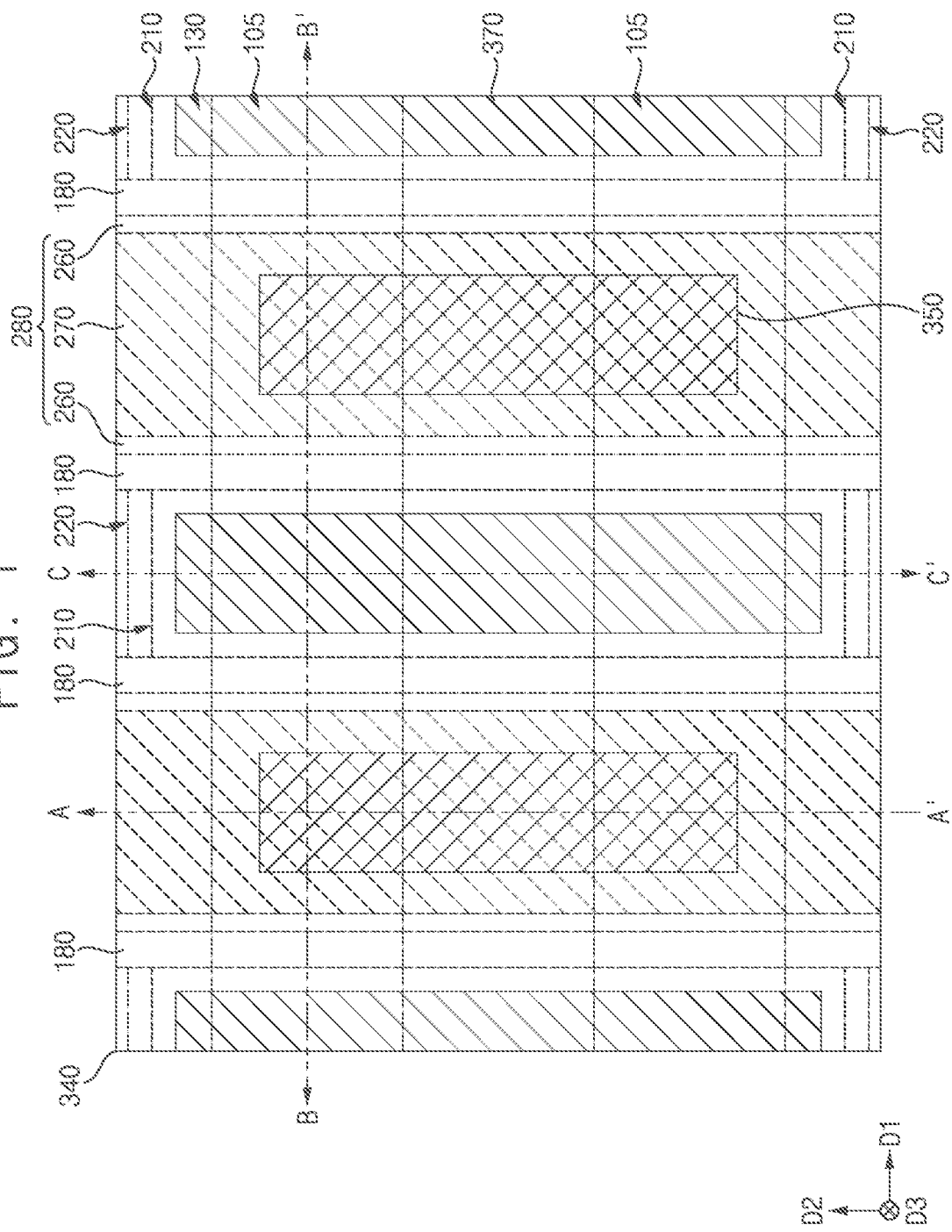
FIGS. 1 to 4 are a plan view and cross-sectional views of a semiconductor device in accordance with embodiments.
Figure 2:
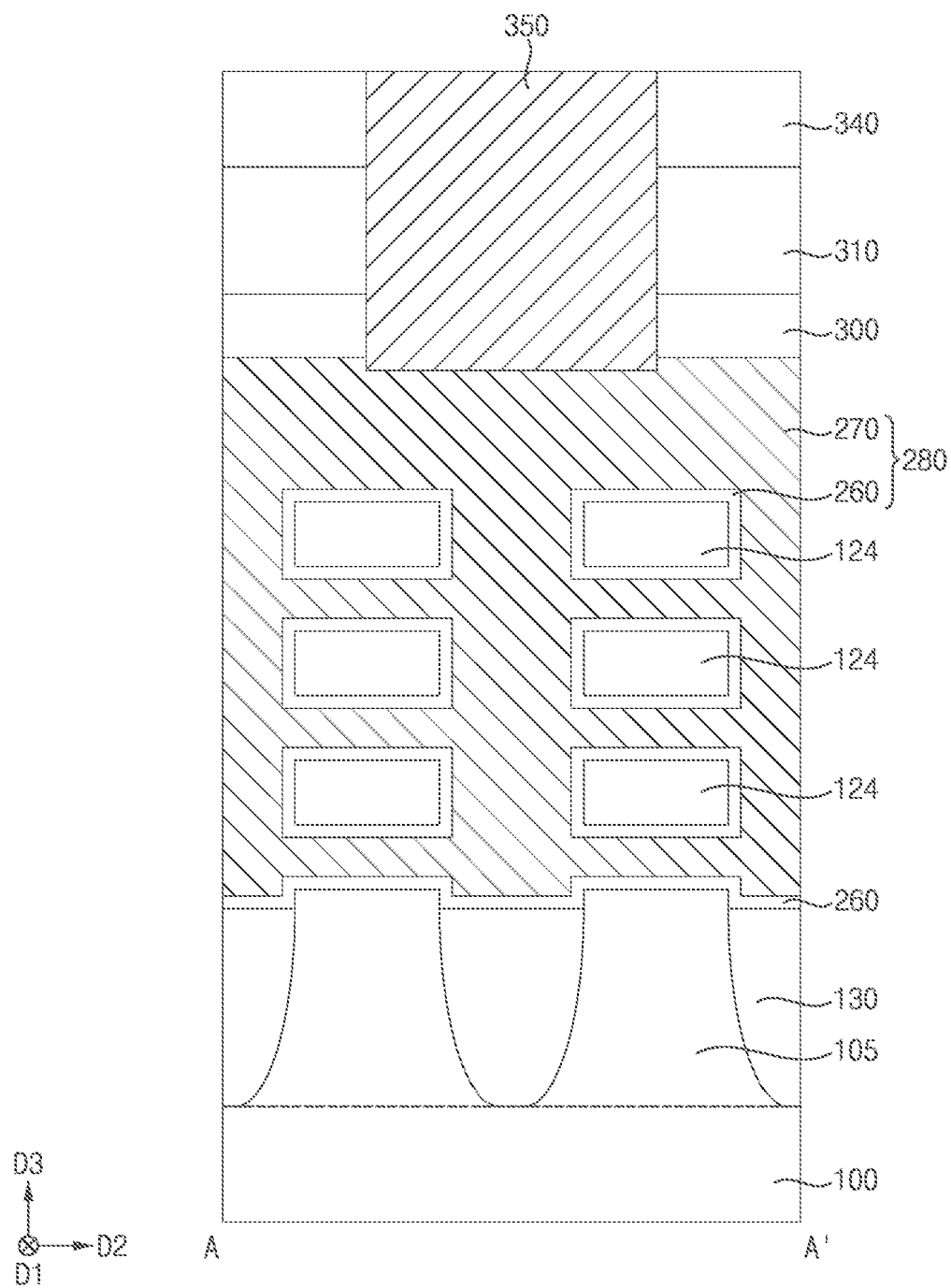
Figure 3:
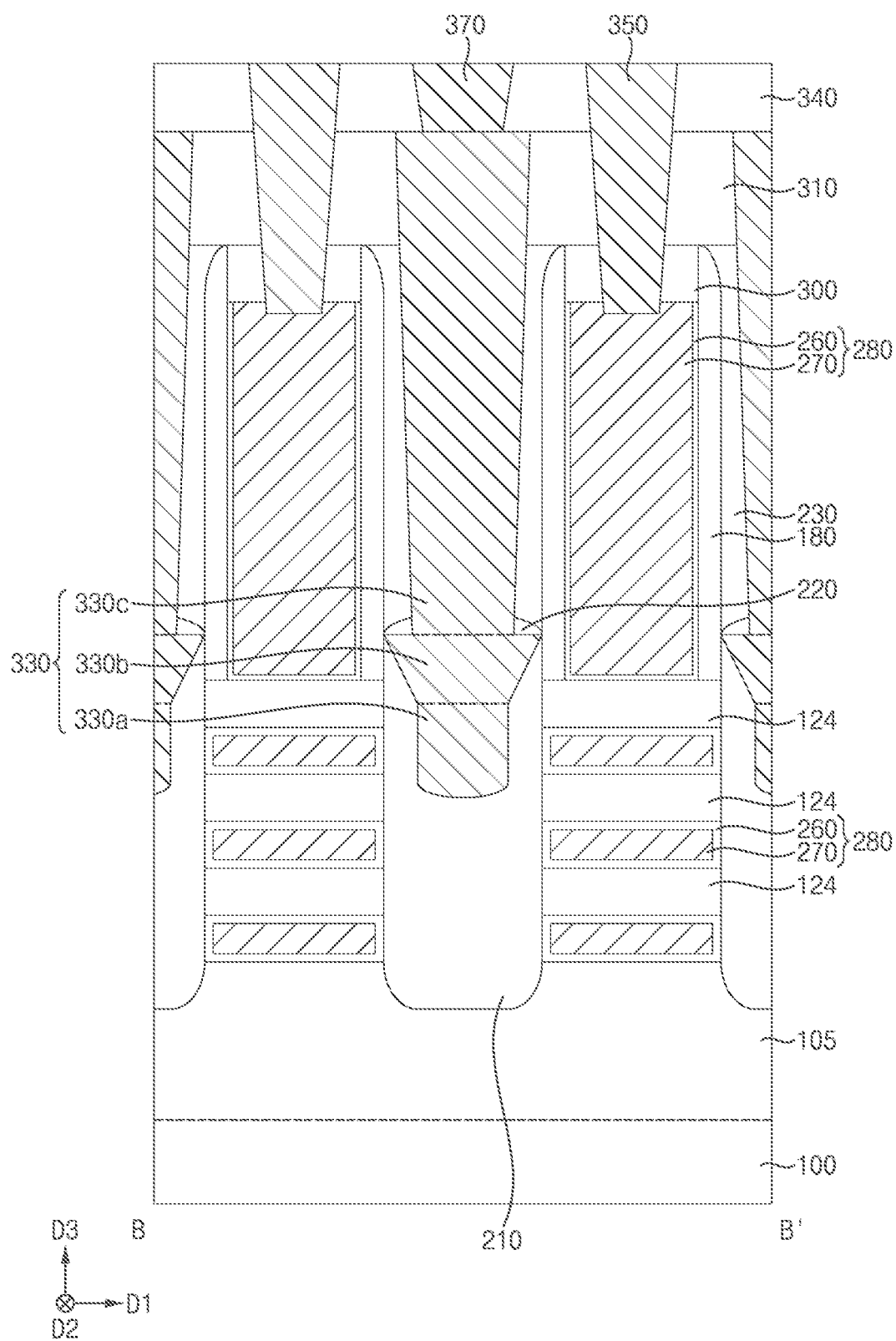
Figure 4:
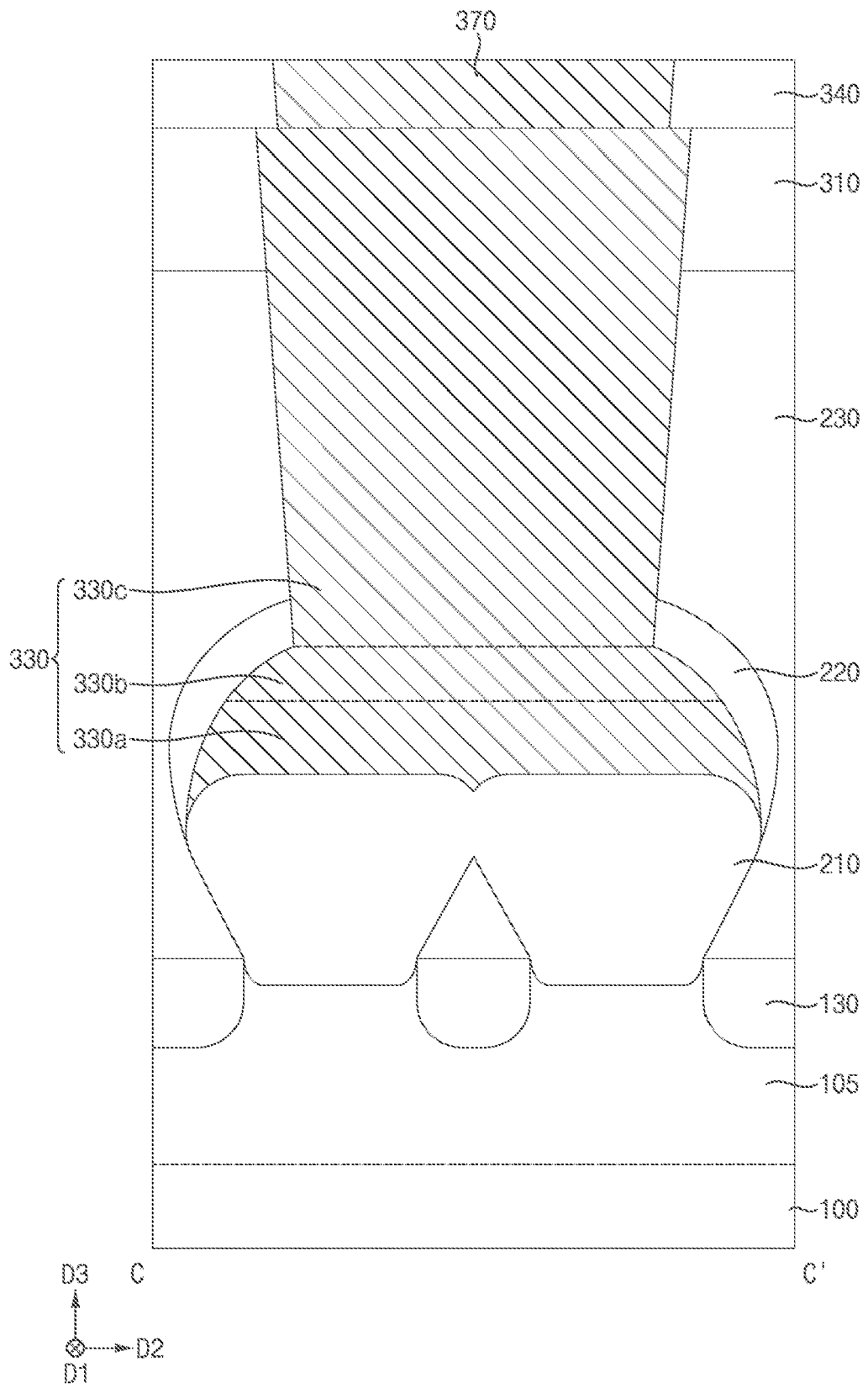

FIGS. 1 to 4 are a plan view and cross-sectional views of a semiconductor device in accordance with embodiments. For example, FIG. 1 is a plan view, and FIGS. 2 to 4 are cross-sectional views. FIG. 2 is a cross-sectional view taken along line A-A' of FIG. 1, FIG. 3 is a cross-sectional view taken along line B-B' of FIG. 1, and FIG. 4 is a cross-sectional view taken along line C-C' of FIG. 1.

Referring to FIGS. 1 to 4, in an embodiment, a semiconductor device includes an active pattern 105, an isolation pattern 130, semiconductor patterns 124, a gate structure 280, a gate spacer 180, a capping pattern 300, a first epitaxial layer 210, a second epitaxial layer 220, first and second contact plugs 330 and 350, a via 370 and first to third insulating interlayers 230, 310 and 340.

The substrate 100 includes a semiconductor material, such as at least one of silicon, germanium, silicon-germanium, etc., or III-V semiconductor compounds, such as GaP, GaAs, GaSb, etc. In some embodiments, the substrate 100 includes one of a silicon-on-insulator (SOI) substrate or a germanium-on-insulator (GOI) substrate.

The active pattern 105 has a fin-like shape that protrudes from an upper surface of the substrate 100, and thus may also be referred to as an active fin. A sidewall of the active pattern 105 is covered by the isolation pattern 130. The active pattern 105 extends in the first direction D1, and a plurality of active patterns 105 are spaced apart from each other in the second direction D2. The active pattern 105 includes a material substantially the same as that of the substrate 100, and the isolation pattern 130 includes an oxide, such as silicon oxide.

The semiconductor patterns 124 are formed at a plurality of levels that are spaced apart from each other in the third direction D3, and each of the semiconductor patterns 124 extends a given length in the first direction D1. FIGS. 2 and 3 show that the semiconductor patterns 124 are formed at three levels, respectively, however, embodiments of the inventive concept are not necessarily limited thereto.

FIG. 2 shows two semiconductor patterns 124 that are spaced apart from each other at each level on the active pattern 105 and extend in the first direction D1, however, embodiments of the inventive concept are not necessarily limited thereto, and in other embodiments, more than two semiconductor patterns 124 are spaced apart from each other in the second direction D2 at each level on the active pattern 105.

In embodiments, the semiconductor pattern 124 is a nano-sheet or nano-wire that includes a semiconductor material, such as one or more of silicon or germanium, etc. In embodiments, the semiconductor pattern 124 serves as a channel in a transistor, and thus may also be referred to as a channel.

The gate structure 280 extends in the second direction D2 on the active pattern 105 and the isolation pattern 130, and includes a gate insulation pattern 260 and a gate electrode 270.

In embodiments, the gate structure 280 surrounds a central portion of each of the semiconductor patterns 124, and covers lower and upper surfaces and opposite sidewalls of the central portion of each of the semiconductor patterns 124.

In embodiments, the gate insulation pattern 260 is stacked on a surface of each of the semiconductor patterns 124, an upper surface of the active pattern 105, an upper surface of the isolation pattern 130, a portion of a sidewall of the first epitaxial layer 210 and an inner sidewall of the gate spacer 180, and the gate electrode 270 fills a space between semiconductor patterns 124 that are spaced apart from each other in the third direction D3, a space between the active pattern 105 and a lowermost semiconductor pattern 124, and a space between gate spacers 180 that are spaced apart from each other in the first direction D1 on an uppermost semiconductor pattern 124.

Hereinafter, a portion of the gate structure 280 on the uppermost semiconductor pattern 124 may be referred to as an upper portion of the gate structure 280, and a portion of the gate structure 280 under the upper portion may be referred to as a lower portion of the gate structure 280.

The gate insulation pattern 260 includes an oxide, such as silicon oxide. The gate electrode 270 includes a metal nitride, such as at least one of titanium nitride, titanium aluminum nitride, tantalum nitride, or tantalum aluminum nitride, etc., a metal alloy, such as at least one of titanium aluminum, titanium aluminum carbide, titanium aluminum oxynitride, titanium aluminum carbonitride, or titanium aluminum oxycarbonitride, etc., a metal carbide, a metal oxynitride, a metal carbonitride, a metal oxycarbonitride, or a low resistance metal, such as tungsten, aluminum, copper, or tantalum.

The gate spacer 180 is formed on each of opposite sidewalls in the first direction D1 of the gate structure 280.

The capping patters 300 contacts an upper surface of the gate structure 280 and the inner sidewall of the gate spacer 180.

Each of the gate spacer 180 and the capping pattern 300 includes an insulating nitride, such as silicon nitride.

The first epitaxial layer 210 is formed on a portion of the active pattern 105 adjacent to the gate structure 280, and commonly contacts each of opposite sidewalls in the first direction D1 of the semiconductor patterns 124. In some embodiments, the first epitaxial layer 210 contacts an outer sidewall of the gate spacer 180.

In an embodiment, a cross-section in the first direction D1 of the first epitaxial layer 210 has a concave upper surface. The first epitaxial layer 210 includes a lower portion and an upper portion, and the upper portion of the first epitaxial layer 210 protrudes in the third direction D3 from an edge portion in the first direction D1 of the lower portion of the first epitaxial layer 210.

In embodiments, a width in the first direction D1 of a first portion of the first epitaxial layer 210 is substantially constant along the third direction D3, and a width in the first direction D1 of a second portion of the first epitaxial layer 210 on the first portion thereof gradually decreases along the third direction D3 from a bottom to top thereof.

In embodiments, the first epitaxial layer 210 includes one of a single crystalline silicon or a single crystalline silicon carbide doped with n-type impurities, and thus serves as a source/drain region of an n-channel metal oxide semiconductor (NMOS) transistor. Accordingly, the first epitaxial layer 210 may be referred to as a source/drain layer 210.

The second epitaxial layer 220 is formed on the first epitaxial layer 210. In embodiments, the second epitaxial layer 220 includes silicon or p-type impurities.

The first insulating interlayer 230 is formed on the substrate 100, and covers an upper surface of the second epitaxial layer 220 and the outer sidewall of the gate spacer 180. The second insulating interlayer 310 is formed on the first insulating interlayer 230, the capping pattern 300 and the gate spacer 180. The third insulating interlayer 340 is formed on the second insulating interlayer 310 and the first contact plug 330.

Each of the first to third insulating interlayers 230, 310 and 340 includes an insulating material, such as at least one of silicon oxycarbide, silicon oxide, silicon nitride, silicon oxynitride, silicon carbonitride, or silicon oxycarbonitride, etc.

The first contact plug 330 includes a lower portion 330a, a middle portion 330b and an upper portion 330c that are sequentially stacked in the third direction D3.

FIG. 3 shows that a lower surface of the first contact plug 330 is formed between upper and lower surfaces of a semiconductor pattern 124 that is at a second level down from above, however, embodiments of the inventive concept are not necessarily limited thereto. In other embodiments, the lower surface of the first contact plug 330 is lower than the lower surface of the second level semiconductor pattern 124, or higher than the upper surface of the second level semiconductor pattern 124.

In embodiments, a width in the first direction D1 of the lower portion 330a of the first contact plug 330 is substantially constant along the third direction D3. Accordingly, a sidewall in the first direction D1 of the lower portion 330a of the first contact plug 330 is substantially perpendicular to the upper surface of the substrate 100.

In embodiments, a width in the first direction D1 of the middle portion 330b of the first contact plug 330 increases from a bottom to a top thereof along the third direction D3. Accordingly, a sidewall in the first direction D1 of the middle portion 330b of the first contact plug 330 is inclined with respect to the upper surface of the substrate 100.

In embodiments an upper surface of the middle portion 330b of the first contact plug 330 is substantially coplanar with an uppermost surface of the first epitaxial layer 210.

In embodiments, a width in the first direction D1 of the upper surface of the middle portion 330b of the first contact plug 330 is greater than a width in the first direction D1 of a lower surface of the upper portion 330b of the first contact plug 330.

A lower sidewall of the upper portion 330c of the first contact plug 330 is covered by the second epitaxial layer 220.

The second contact plug 350 extends through the second and third insulating interlayers 310 and 340 and the capping pattern 300 to contact the gate electrode 270. Each of the first and second contact plugs 330 and 350 includes, e.g., at least one of a metal or a metal nitride, etc.

The via 370 extends through the third insulating interlayer 340 to contact the first contact plug 330, and includes, e.g., at least one of a metal or a metal nitride, etc.

Upper wirings are further formed on the first and second contact plugs 330 and 350, and apply electric signals to the first and second contact plugs 330 and 350.

In an embodiment, the semiconductor device is a multi-bridge channel field effect transistor (MBCFET) that includes the semiconductor patterns 124 that are spaced apart from each other in the third direction D3 and serving as channels.

As described below with reference to FIGS. 5 to 28, the first contact plug 330 contacts the first epitaxial layer 210 at a large area, and thus a contact resistance between the first contact plug 330 and the first epitaxial layer 210 decreases.

FIGS. 5 to 28 are plan views and cross-sectional views that illustrate a method of manufacturing a semiconductor device in accordance with embodiments. For example, FIGS. 5, 8, 11, 14, 19 and 23 are plan views, and FIGS. 6-7, 9-10, 12-13, 15-18, 20-22 and 24-28 are cross-sectional views.

Figure 6:
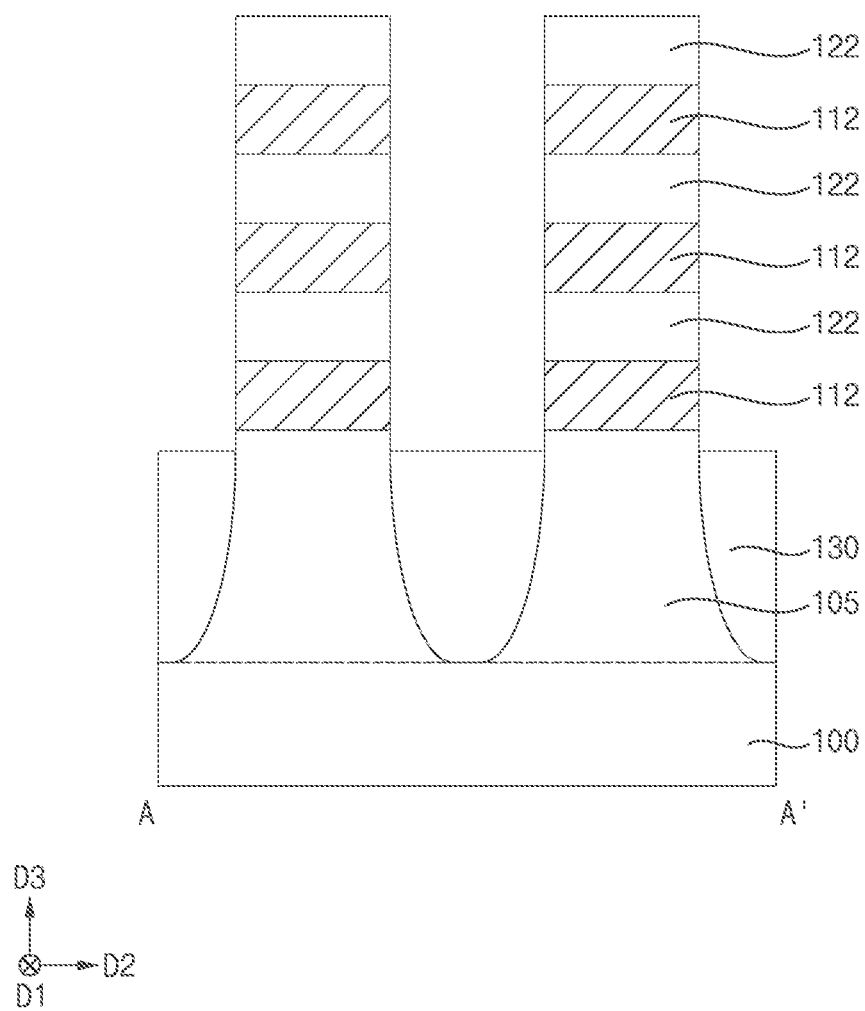
Figure 9:
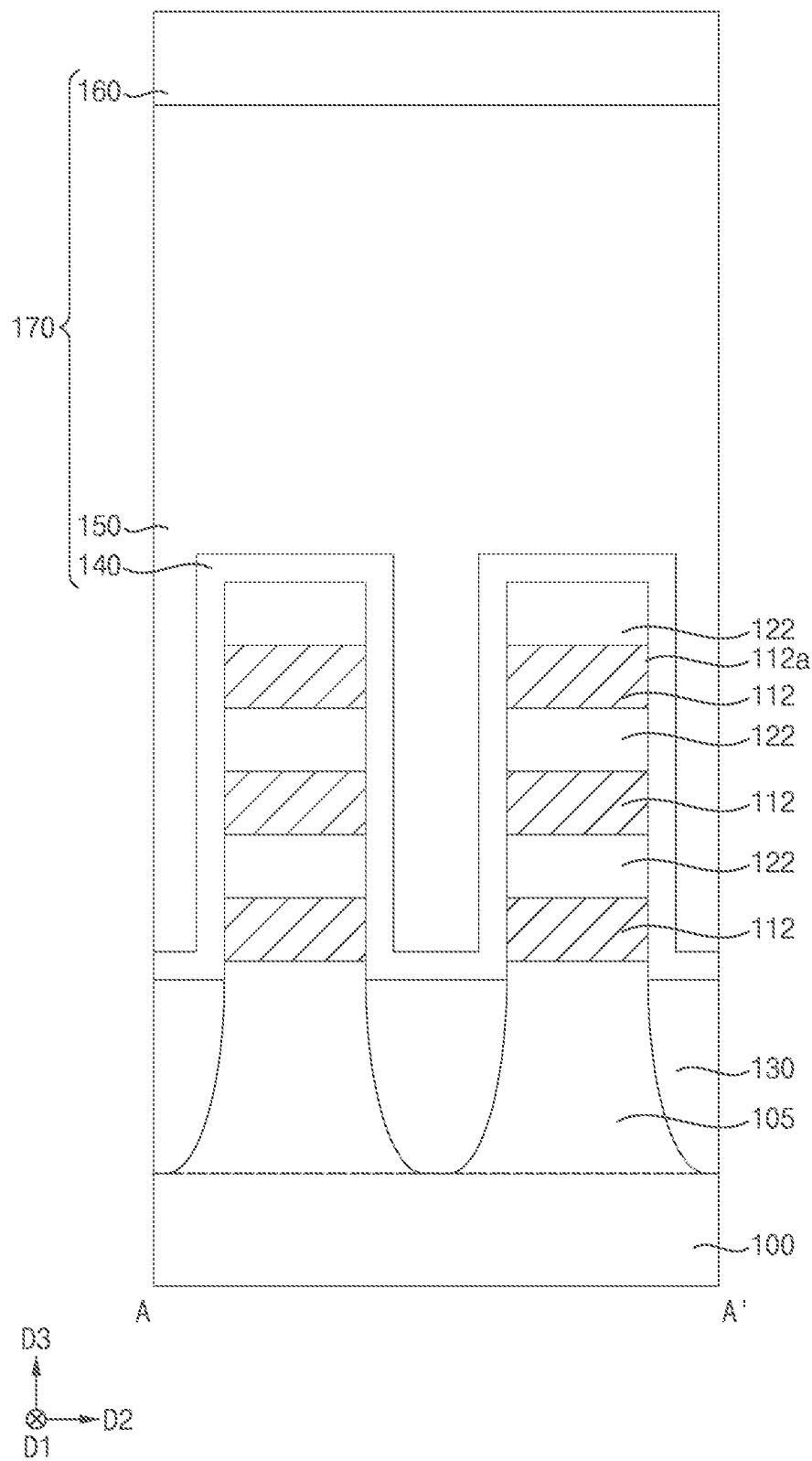

FIGS. 6 and 9 are cross-sectional views taken along lines A-A' of corresponding plan views, FIGS. 7, 10, 12, 15, 17, 20, 22, 24-25 and 27 are cross-sectional views taken along lines B-B' of corresponding plan views, and FIGS. 13, 16, 18, 21, 26 and 28 are cross-sectional views taken along line C-C' of corresponding plan views.

Figure 5:
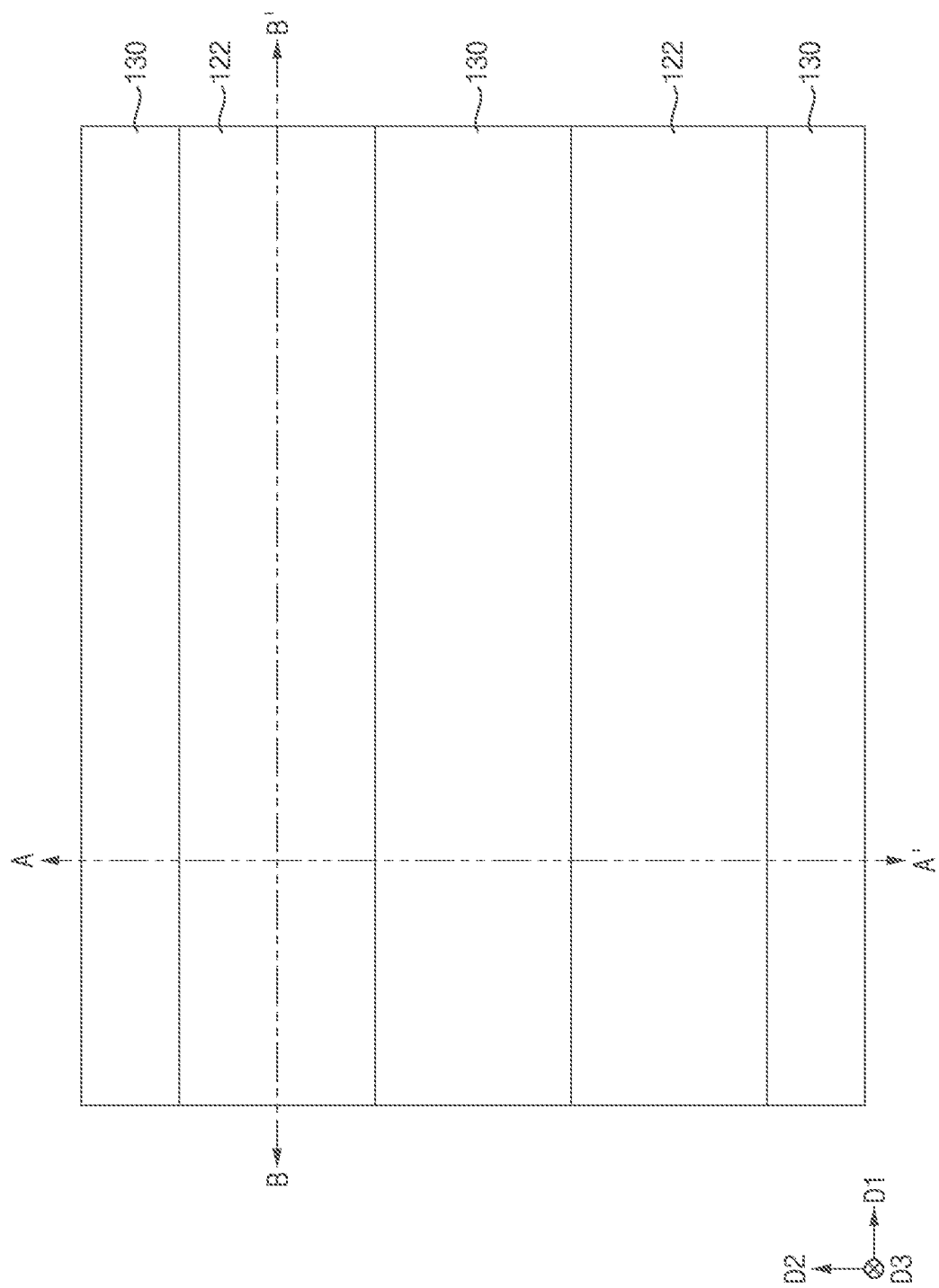

Referring to FIGS. 5 to 7, in an embodiment, a sacrificial epitaxial layer and a semiconductor layer are alternately and repeatedly stacked on a substrate 100, a first etching mask that extends in the first direction D1 is formed on an uppermost semiconductor layer, and the semiconductor layers, the sacrificial epitaxial layers and an upper portion of the substrate 100 are etched using the first etching mask.

Thus, an active pattern 105 that extends in the first direction D1 is formed on the substrate 100, and a fin structure that includes sacrificial lines 112 and semiconductor lines 122 alternately and repeatedly stacked in the third direction D3 is formed on the active pattern 105. In embodiments, the fin structure extends in the first direction D1 on the substrate 100, and a plurality of fin structures are spaced apart from each other in the second direction D2 on the substrate 100.

FIGS. 6 and 7 show three sacrificial lines 112 and three semiconductor lines 122 at three levels, respectively, however, embodiments of the inventive concept are not necessarily limited thereto. The sacrificial lines 112 include a material that has an etching selectivity with respect to the substrate 100 and the semiconductor lines 122, such as silicon-germanium.

An isolation pattern 130 is formed on the substrate 100 that covers a sidewall of the active pattern 105.

Figure 8:
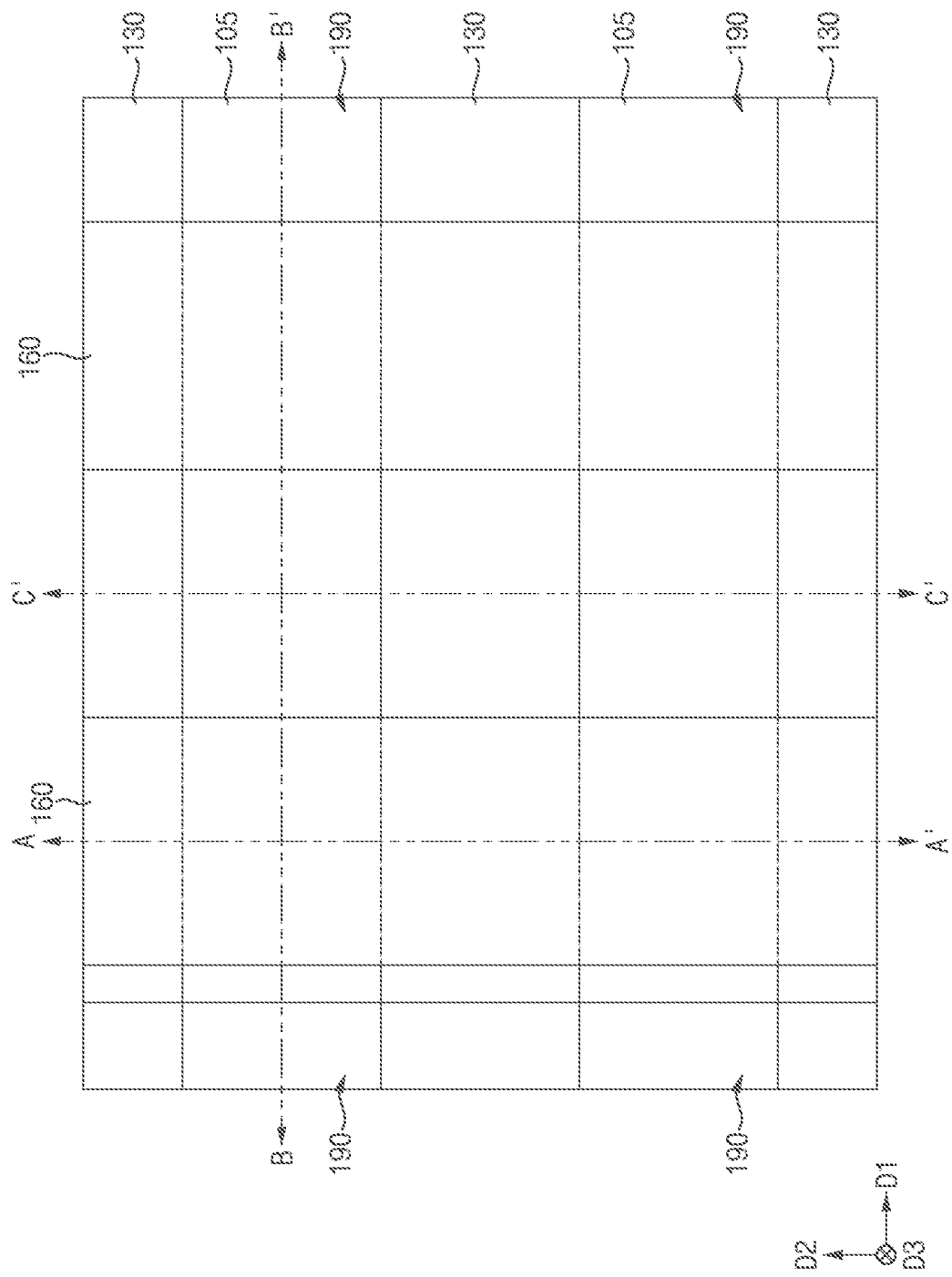
Figure 10:
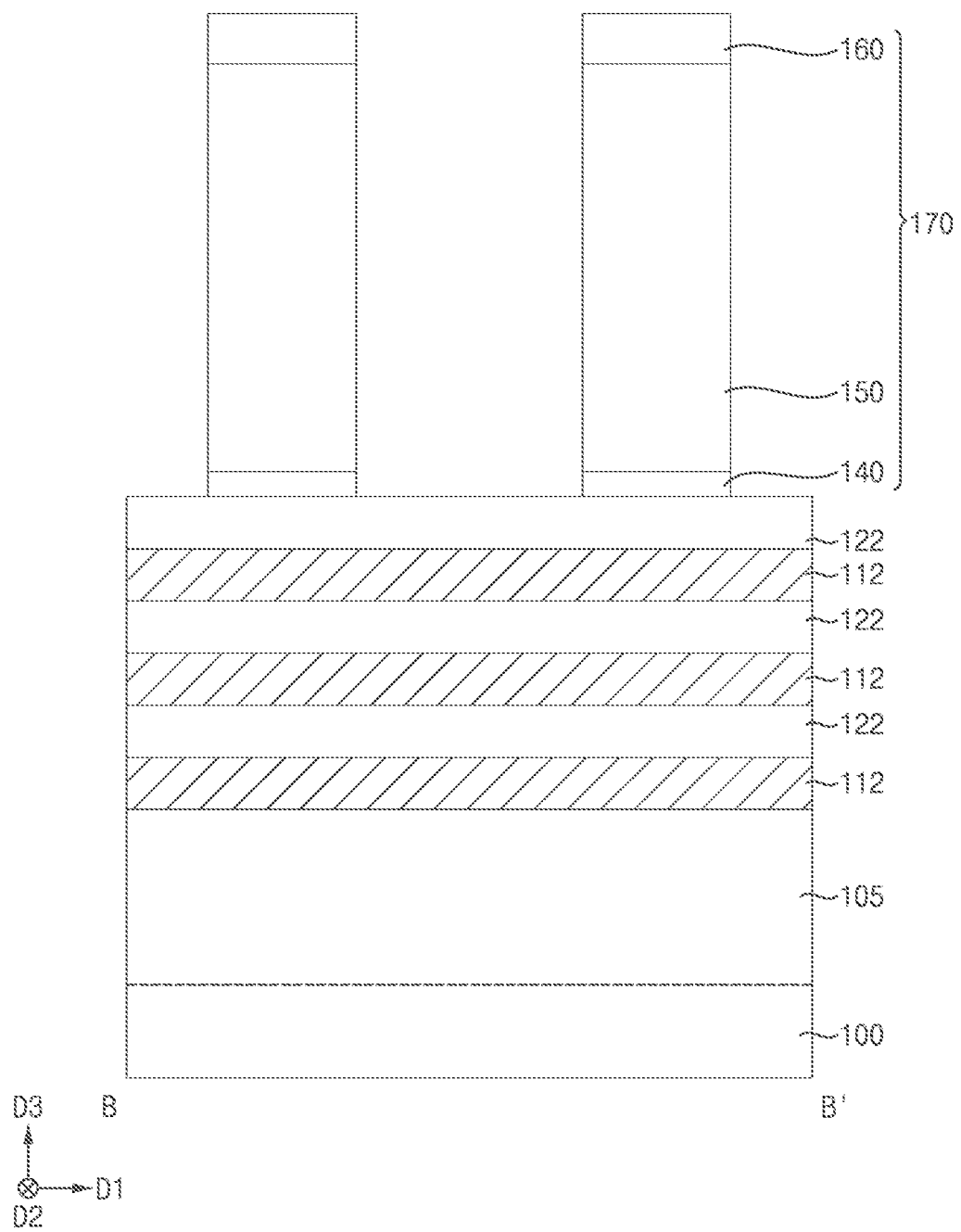

Referring to FIGS. 8 and 10, in an embodiment, a dummy gate insulation layer, a dummy gate electrode layer and a dummy gate mask are formed on the substrate 100 that cover the fin structure and the isolation pattern 130, a second etching mask that extends in the second direction D2 is formed on the dummy gate mask layer, and the dummy gate mask layer is etched using the second etching mask to form a dummy gate mask 160.

The dummy gate electrode layer and the dummy gate insulation layer are etched using the dummy gate mask 160 as an etching mask to form a dummy gate electrode 150 and a dummy gate insulation pattern 140, respectively, on the substrate 100.

The dummy gate insulation pattern 140, the dummy gate electrode 150 and the dummy gate mask 160 that are sequentially stacked in the third direction D3 on the active pattern 105 and a portion of the isolation pattern 130 adjacent thereto form a dummy gate structure 170.

In embodiments, the dummy gate structure 170 extends in the second direction D2 on the fin structure and the isolation pattern 130, and covers an upper surface and sidewalls of the fin structure that are opposite in the second direction D2.

In embodiments, a plurality of dummy gate structures 170 are spaced apart from each other in the first direction D1.

Figure 11:
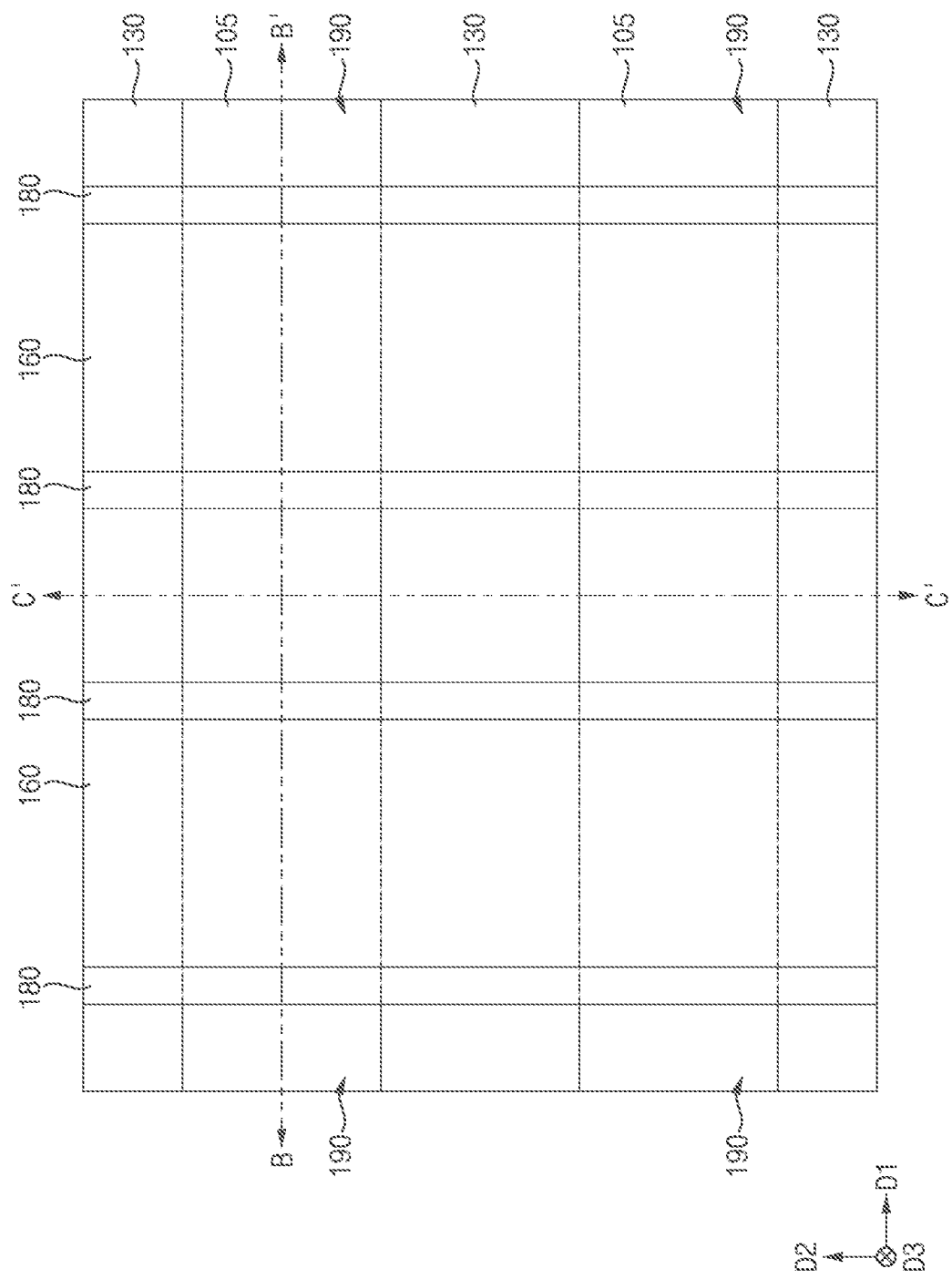
Figure 12:
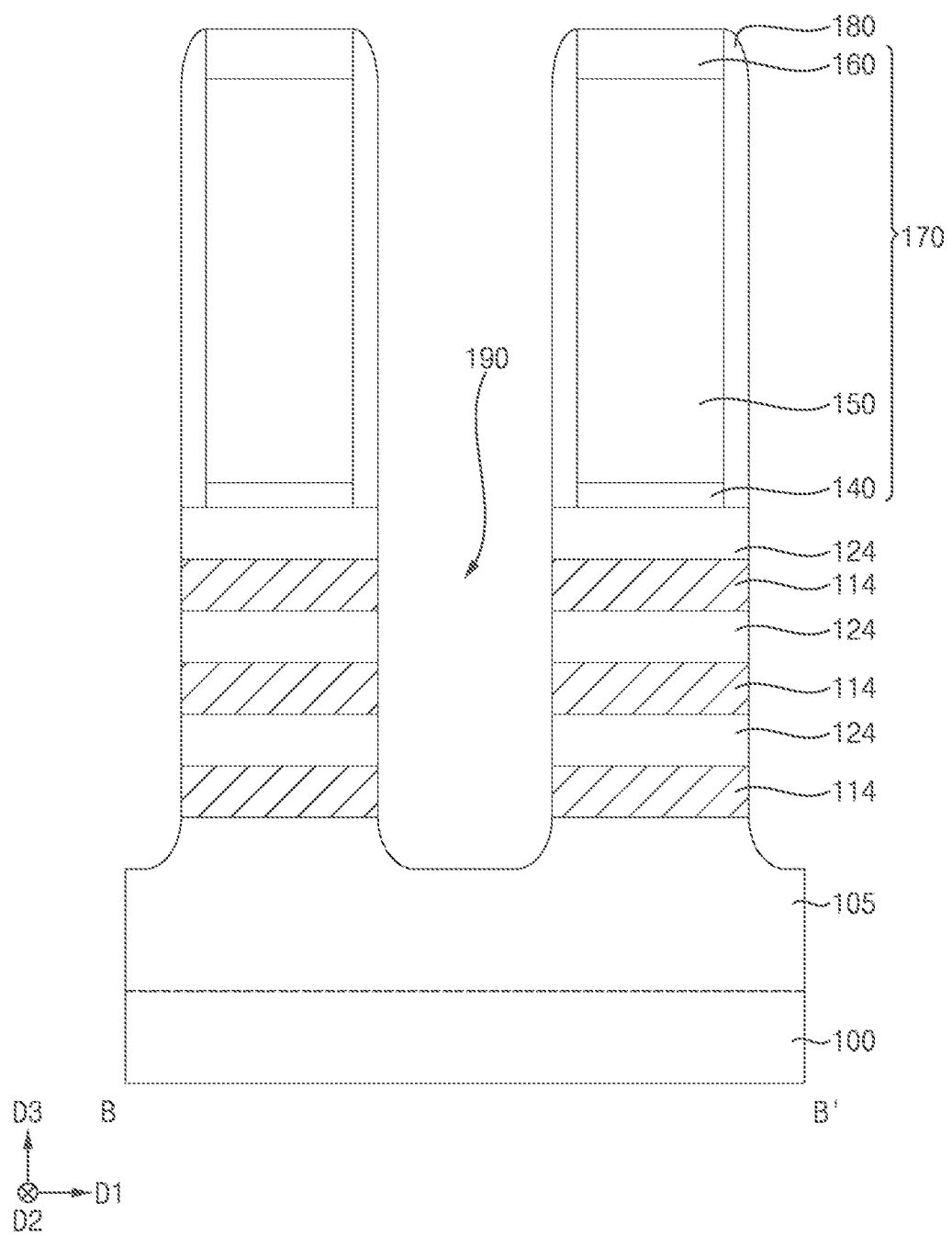
Figure 13:
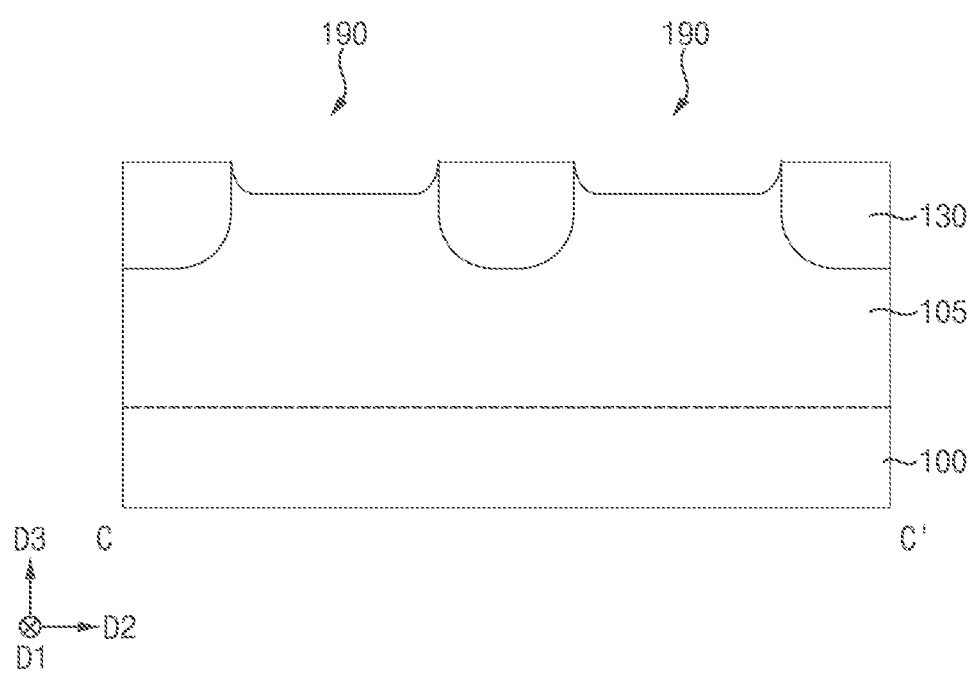

Referring to FIGS. 11 to 13, in an embodiment, a gate spacer 180 is formed on a sidewall of the dummy gate structure 170.

For example, a spacer layer is formed on the substrate 100, which has the tin structure, the isolation pattern 130 and the dummy gate structure 170 formed thereon, and the spacer layer is anisotropically etched to form the gate spacer 180 on sidewalk of the dummy gate structure 170 that are opposite first direction D1.

The fin structure and an upper portion of the active pattern 105 are etched using the dummy gate structure 170 and the gate spacer 180 as an etching mask to form a first opening 190.

Thus, the sacrificial lines 112 and the semiconductor lines 122 under the dummy gate structure 170 and the gate spacers 180 are transformed into sacrificial patterns 114 and semiconductor patterns 124, respectively, and the fin structure that extends in the first direction D1 is divided into a plurality of parts spaced apart from each other in the first direction D1.

Hereinafter, the dummy gate structure 170, the gate spacer 180 on each of opposite sidewalls of the dummy gate structure 170 and the fin structure may be referred to as a stack structure. In embodiments, the stack structure extends in the second direction D2, and a plurality of stack structures are spaced apart from each other in the first direction D1.

Figure 14:
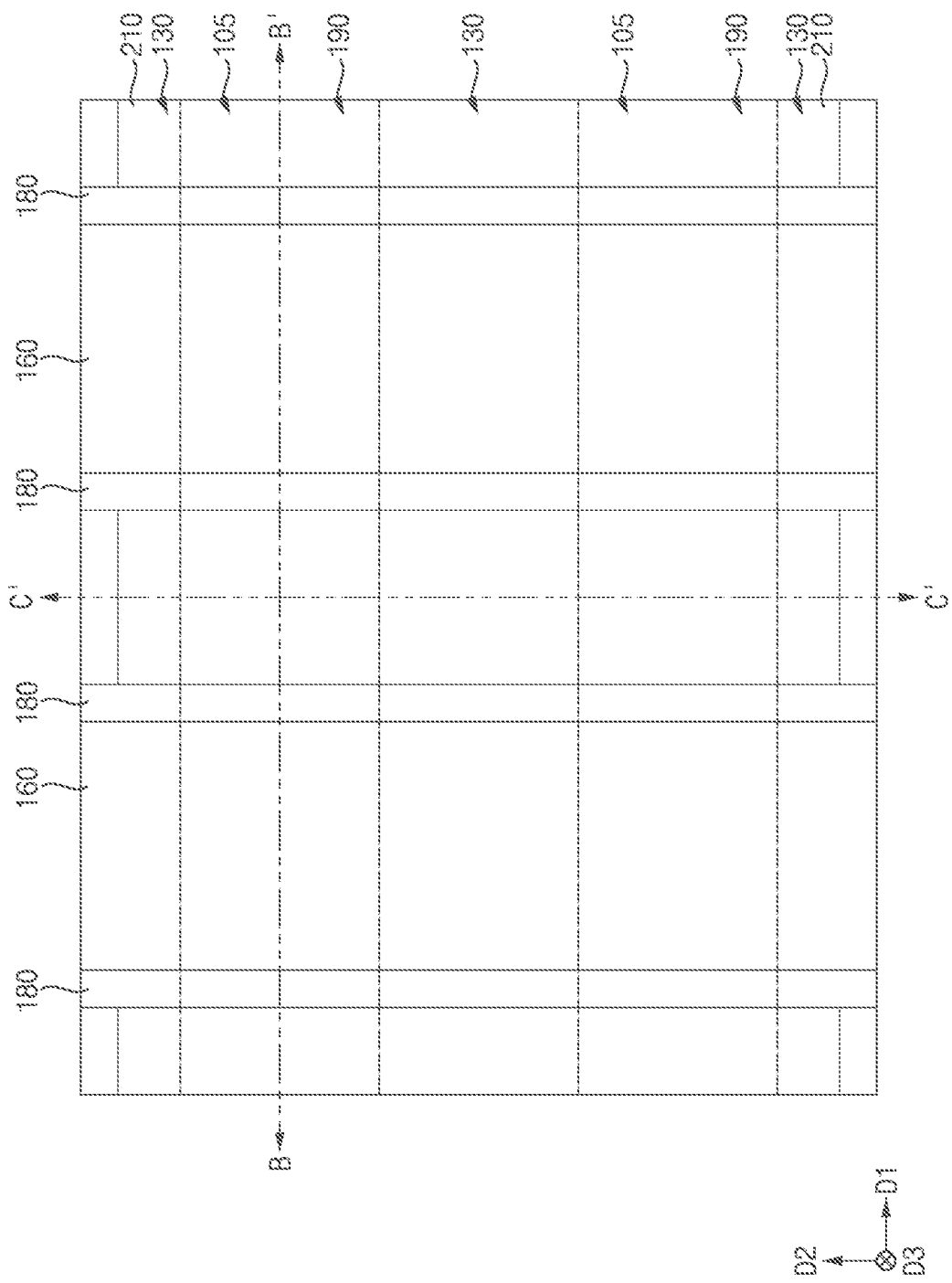
Figure 15:
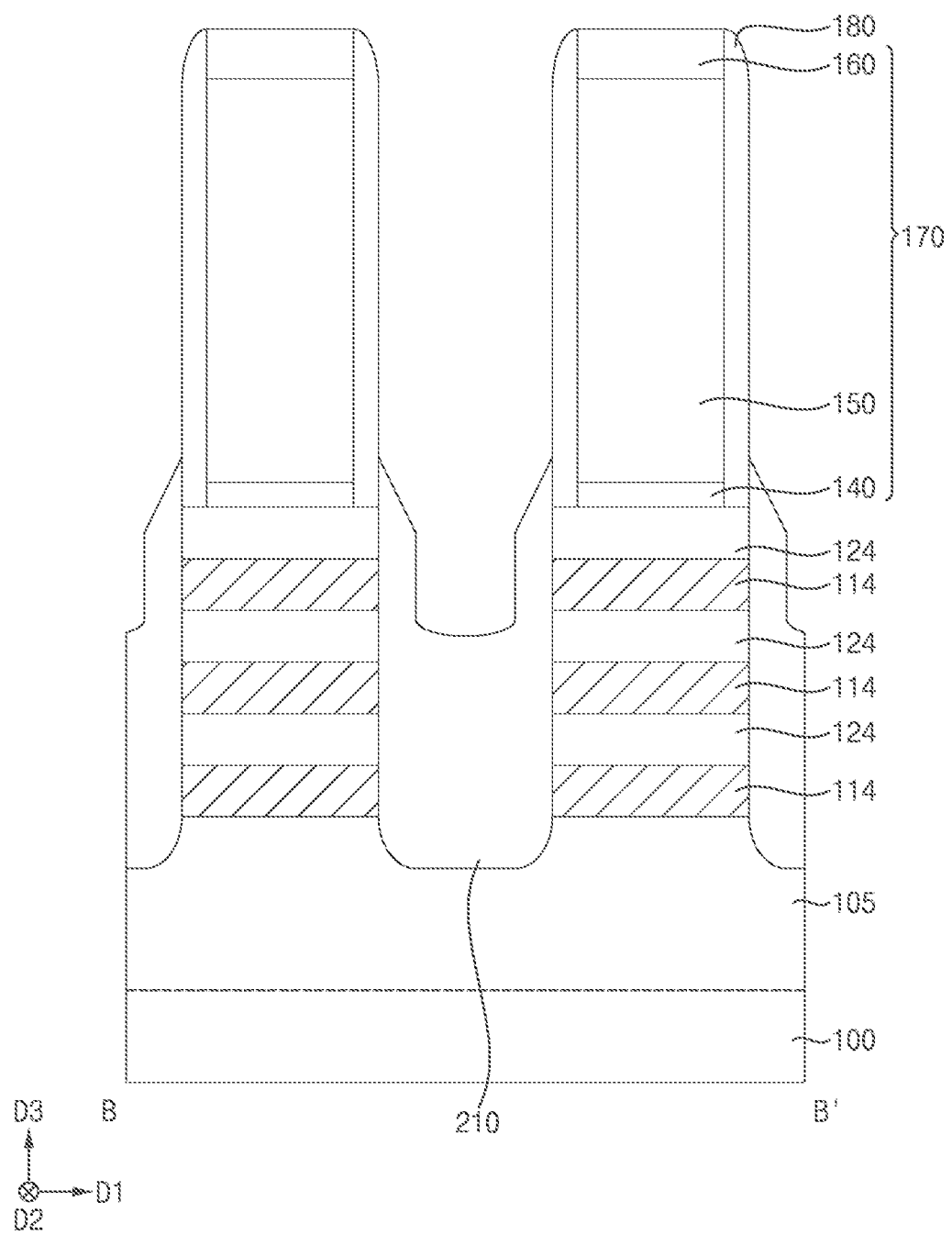
Figure 16:
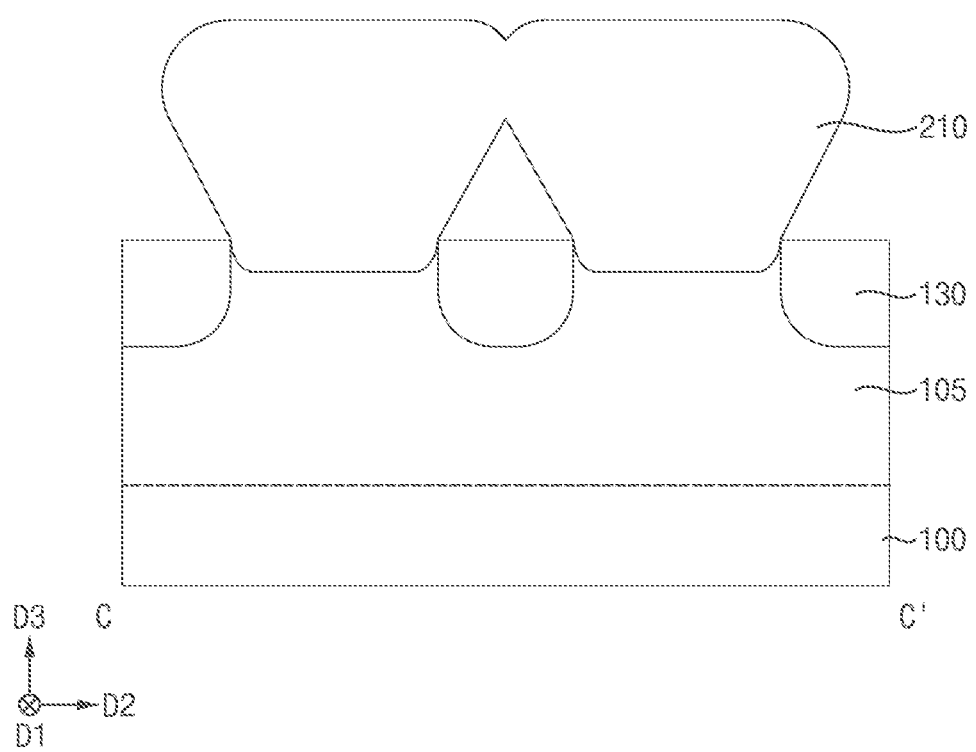

Referring to FIGS. 14 to 16, in an embodiment, a first selective epitaxial growth (SEG) process is performed using the upper surface of the active pattern 105 and the sidewalls of the semiconductor patterns 124 and the sacrificial patterns 114 exposed by the first opening 190 as a seed to form a first epitaxial layer 210 in the first opening 190.

In an embodiment, the first SEG process is performed using a silicon source gas, such as disilane ($Si_2H_6$) gas and a $SiH_3CH_3$ gas, and thus a single crystal silicon carbide (SiC) layer may be formed as the first epitaxial layer 210. An n-type impurity source gas, such as $PH_3$, etc., may also be used so that a single crystalline silicon carbide layer doped with n-type impurities is formed as the first epitaxial layer 210.

The first epitaxial layer 210 grows in the third direction D3 from the active pattern 105 exposed by the first opening 190, and grows in the first direction D1 from the sidewalls of the semiconductor patterns 124 and the sacrificial patterns 114 exposed by the first opening 190. In embodiments, a cross-section in the first direction D1 of the first epitaxial layer 210 has a concave upper surface. The first epitaxial layer 210 includes a lower portion and an upper portion, and the upper portion protrudes in the third direction D3 from an edge portion in the first direction D1 of the lower portion.

In embodiments, a width in the first direction D1 of the upper portion of the first epitaxial layer 210 is substantially constant from a bottom portion to a central portion at a given height, and gradually decreases along the third direction D3 from the central portion to a top portion of the upper portion of the first epitaxial layer 210.

Figure 17:
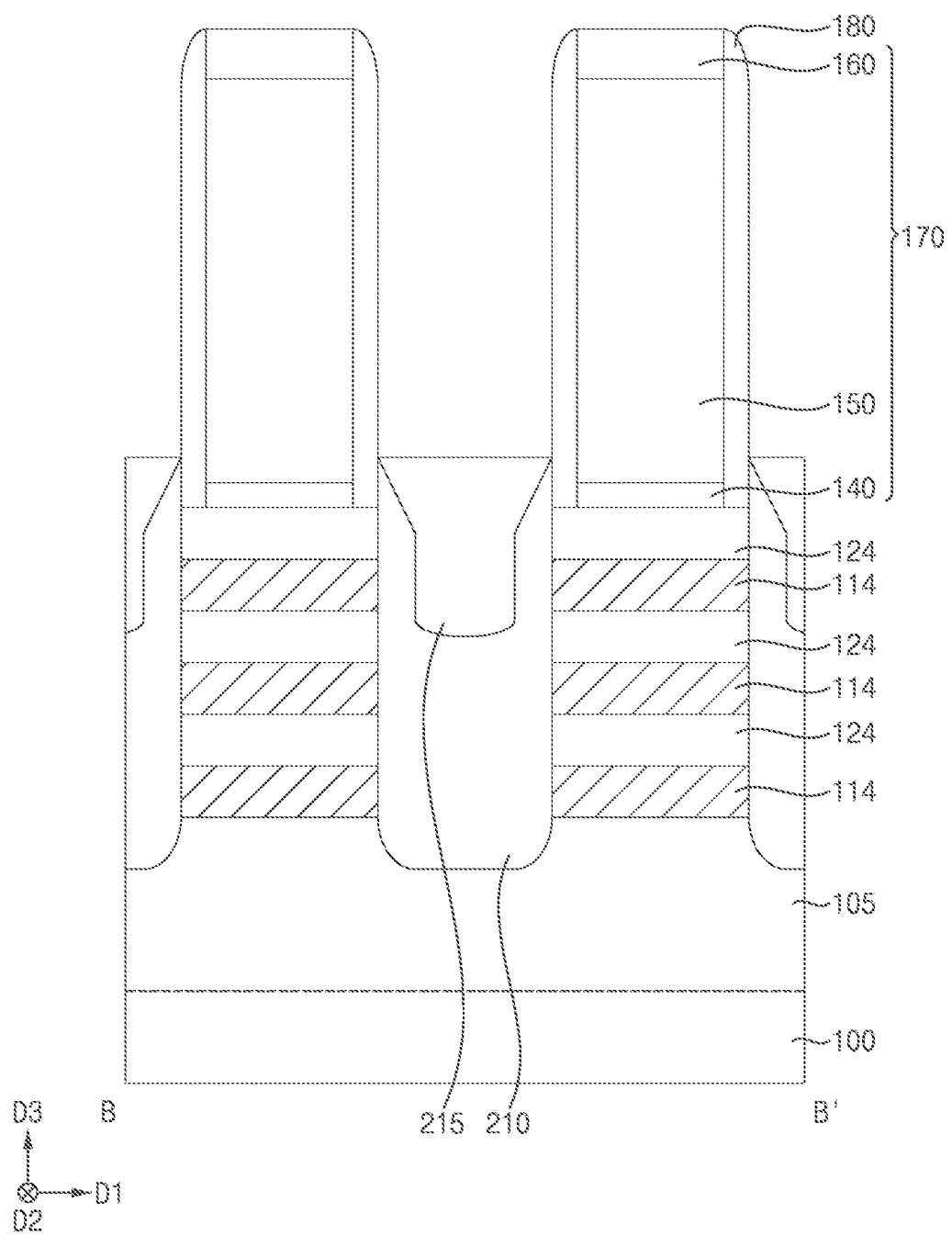
Figure 18:
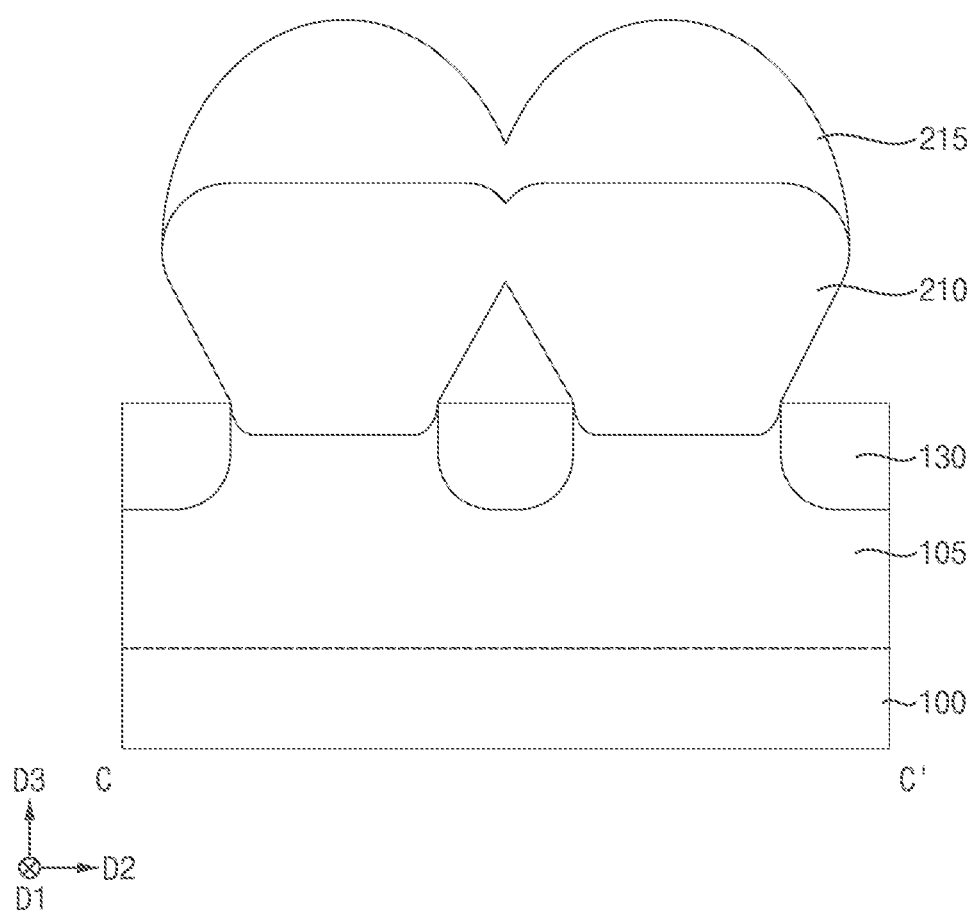

Referring to FIGS. 17 to 18, in an embodiment, a second SEG process is performed using the first epitaxial layer 210 as a seed to form a sacrificial epitaxial layer 215 on the first epitaxial layer 210.

In embodiments, an uppermost surface of the sacrificial epitaxial layer 215 is substantially coplanar with an uppermost surface of the first epitaxial layer 210. In an embodiment, a height in the third direction D3 along the first direction D1 of an upper surface of the sacrificial epitaxial layer 215 is substantially constant In an embodiment, the second SEG process is performed using a silicon source gas, such as dichlorosilane ($SiH_2Cl_2$) gas and a germanium source gas, such as germane ($GeH_4$) gas, and thus a single crystalline silicon-germanium layer is formed as the sacrificial epitaxial layer 215. Alternatively, in an embodiment, the second SEG process is performed using a germanium source gas, such as germane ($GeH_4$) gas, and thus a single crystalline germanium layer is formed as the sacrificial epitaxial layer 215.

Figure 19:
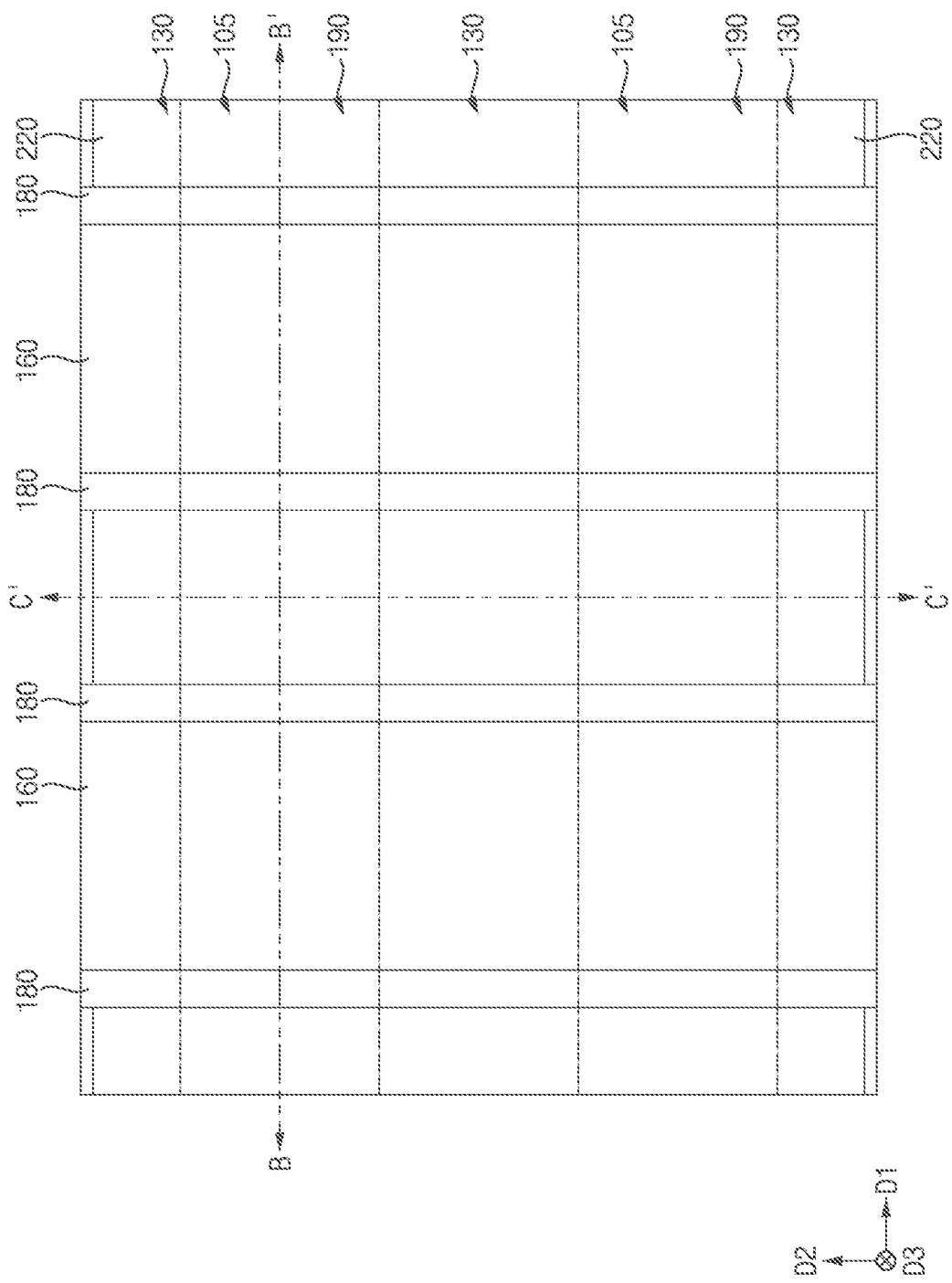
Figure 20:
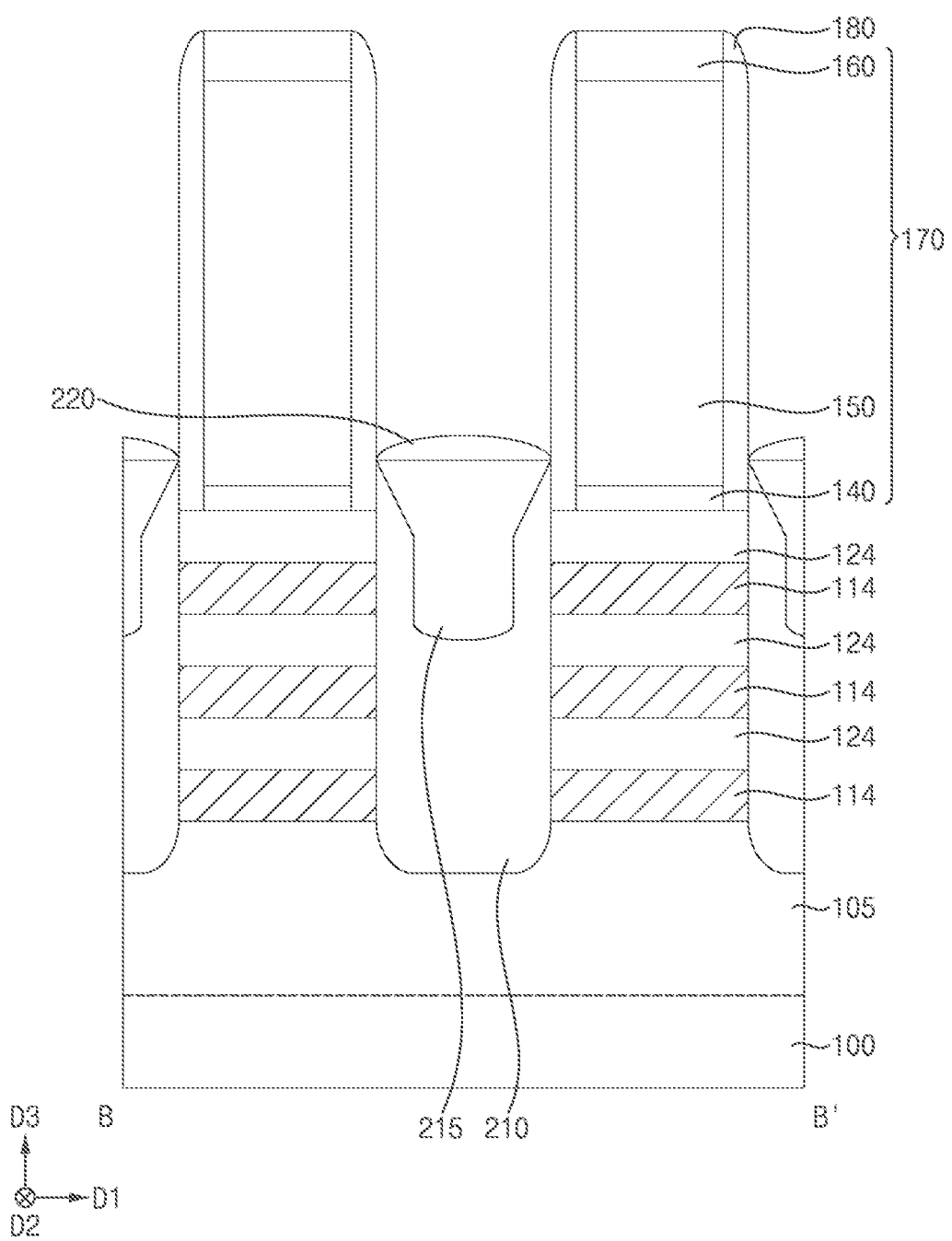
Figure 21:
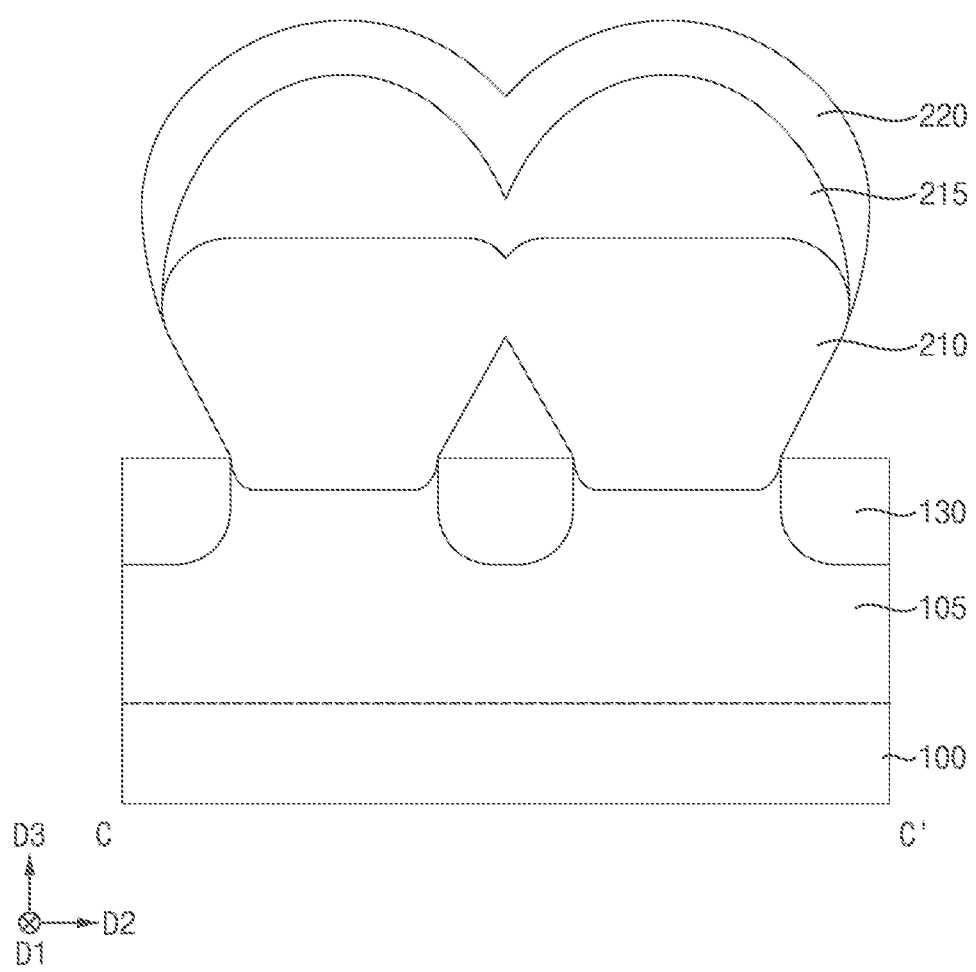

Referring to FIGS. 19 to 21, in an embodiment, a third SEG process is performed using the sacrificial epitaxial layer 215 as a seed to form a second epitaxial layer 220 on the sacrificial epitaxial layer 215.

The second epitaxial layer 220 covers the sacrificial epitaxial layer 215. In an embodiment, an upper surface of a cross-section in the first direction D1 of the second epitaxial layer 220 has a upwardly curved convex shape.

The third SEG process is performed using a silicon source gas, such as dichlorosilane ($SiH_2Cl_2$) gas, and thus a single crystalline silicon layer is formed as the second epitaxial layer 220. In embodiments, a p-type impurity source gas, such as diborane ($B_2H_6$) gas, is also used so that a single crystalline silicon layer doped with p-type impurities is formed as the second epitaxial layer 220.

The first to third SEG processes that may form the first epitaxial layer 210, the sacrificial epitaxial layer 215 and the second epitaxial layer 220, respectively, are performed in-situ.

Figure 22:
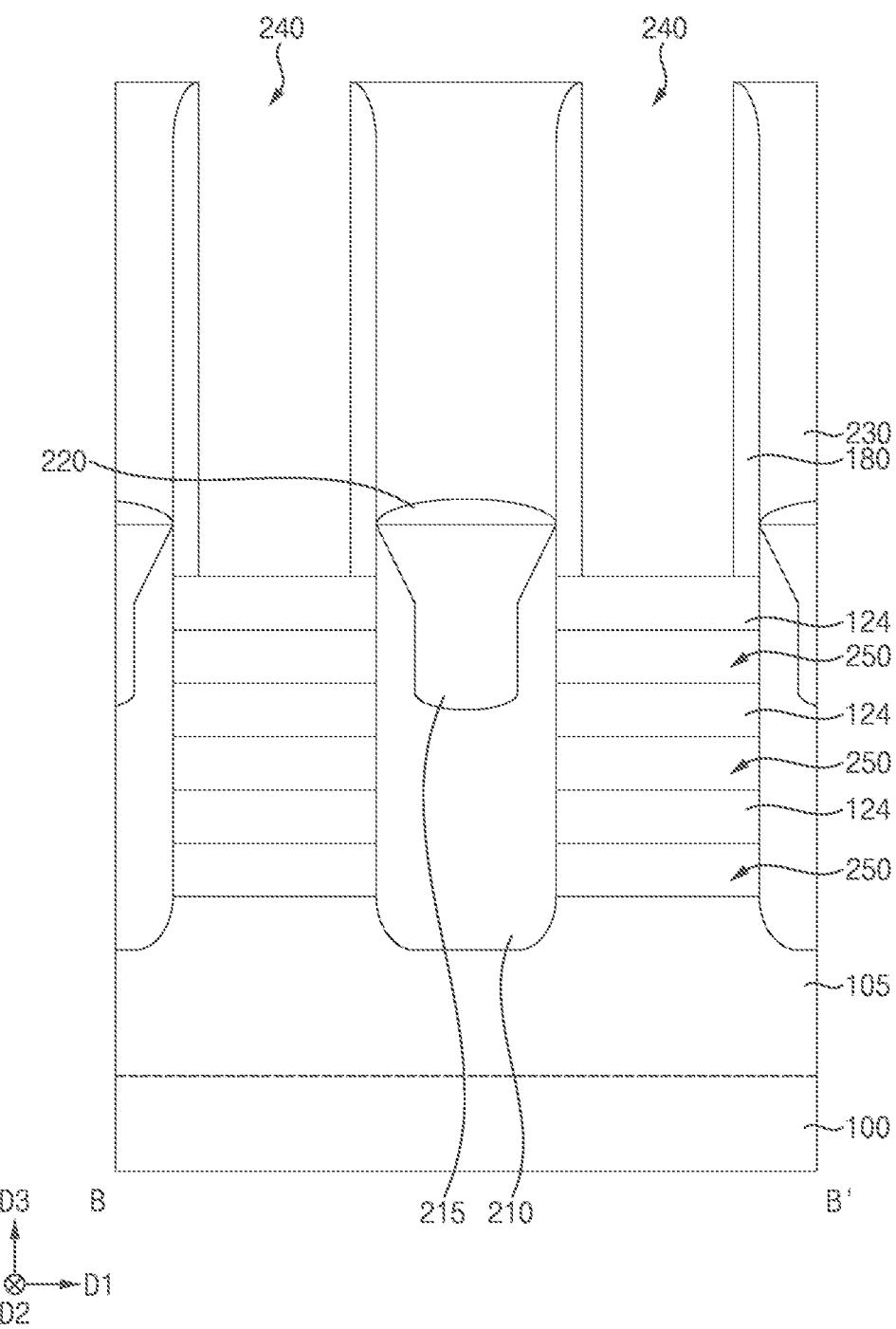

Referring to FIG. 22, in an embodiment, a first insulating interlayer 230 is formed on the substrate 100 that covers the stack structure and the second epitaxial layer 220.

A planarization process is performed until an upper surface of the dummy gate electrode 150 in the stack structure is exposed so that an upper portion of the first insulating interlayer 230 and the dummy gate mask 160 in the dummy gate structure 170 are removed.

The dummy gate electrode 150, the dummy gate insulation pattern 140 and the sacrificial patterns 114 are removed by, e.g., a wet etching process and/or a dry etching process.

Thus, a second opening 240 that exposes an inner sidewall of the gate spacer 180 and an upper surface of an uppermost semiconductor pattern 124, and a third opening 250 that exposes a portion of a sidewall of the first epitaxial layer 210, surfaces of the semiconductor patterns 124 and an upper surface of the active pattern 105, may be formed.

Figure 23:
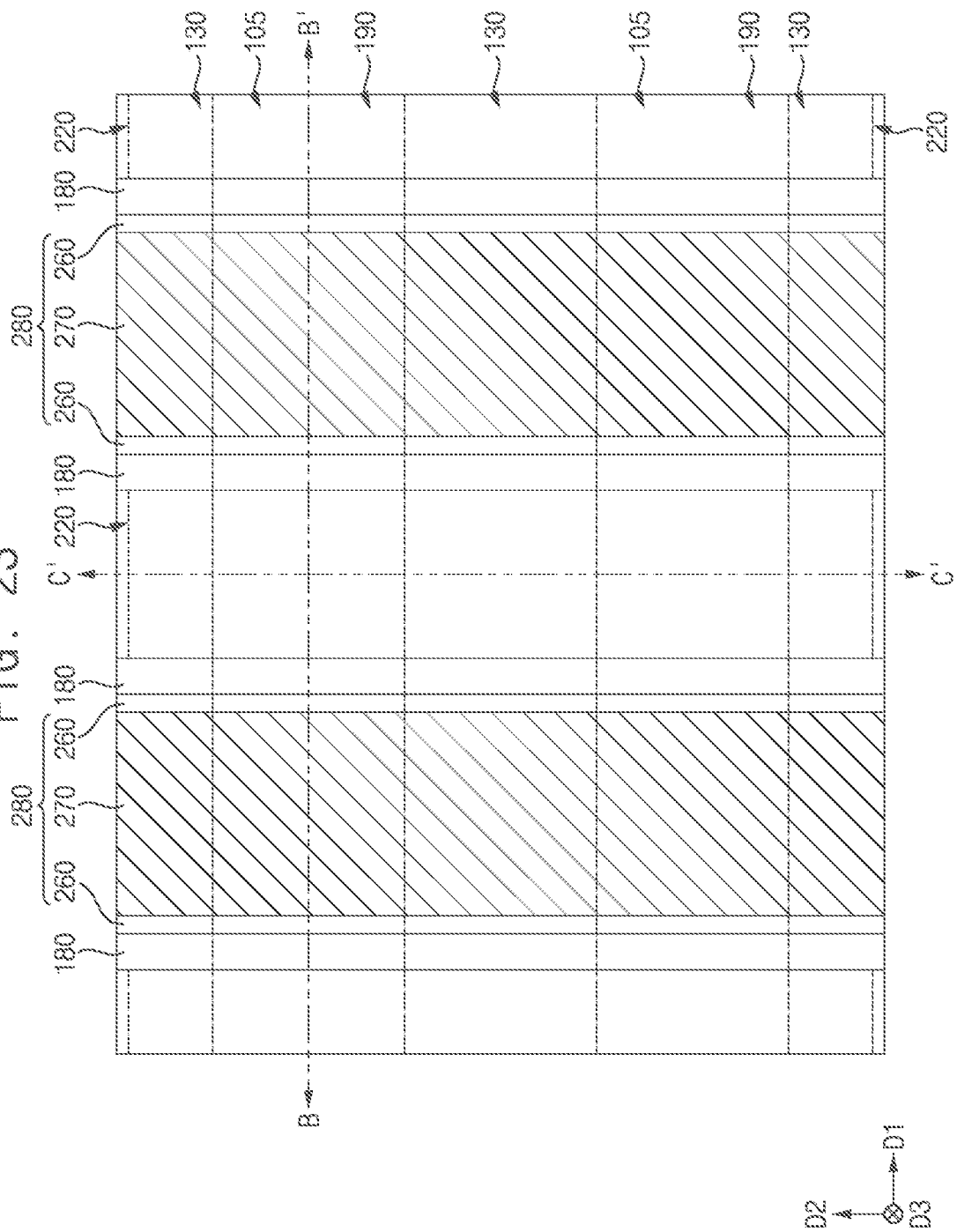
Figure 24:
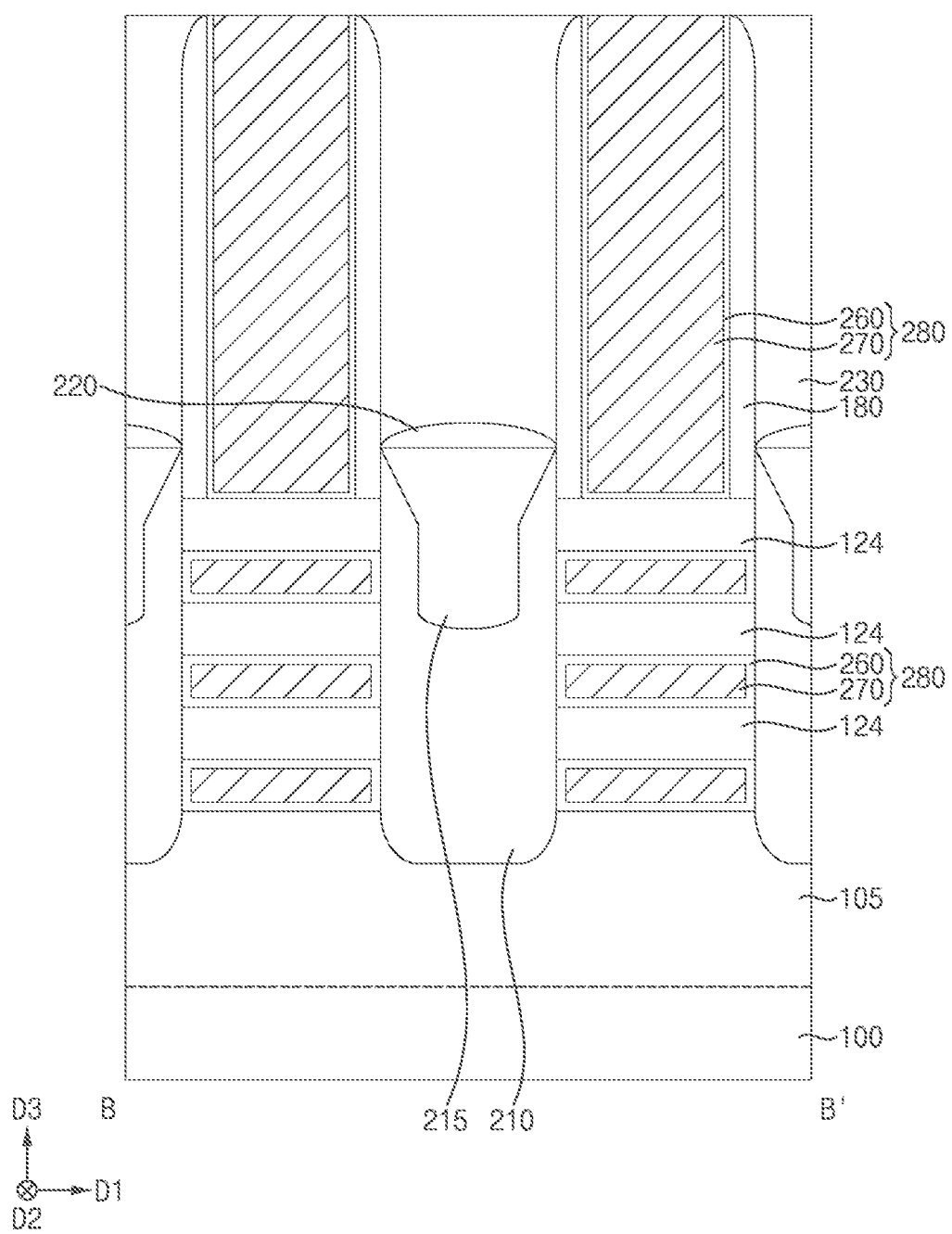

Referring to FIGS. 23 to 24, in an embodiment, a gate insulation layer is formed on the inner sidewall of the gate spacer 180, the surfaces of the semiconductor patterns 124, the upper surface of the active pattern 105, the upper surface of the isolation pattern 130 and the portion of the sidewall of the first epitaxial layer 210 exposed by the second and third openings 240 and 250, and an upper surface of the first insulating interlayer 230, and a gate electrode layer is formed on the gate insulation layer that fills remaining portions of the second and third openings 240 and 250.

In an embodiment, an interface pattern that includes, e.g., silicon oxide, is further formed on the upper surface of the active pattern 105 and the surfaces of the semiconductor patterns 124 before forming the gate insulation layer.

The gate electrode layer and the gate insulation layer are planarized until the upper surface of the first insulating interlayer 230 is exposed. Thus, a gate structure 280 that fills the second and third openings 240 and 250 and includes a gate insulation pattern 260 and a gate electrode 270 are formed.

Figure 25:
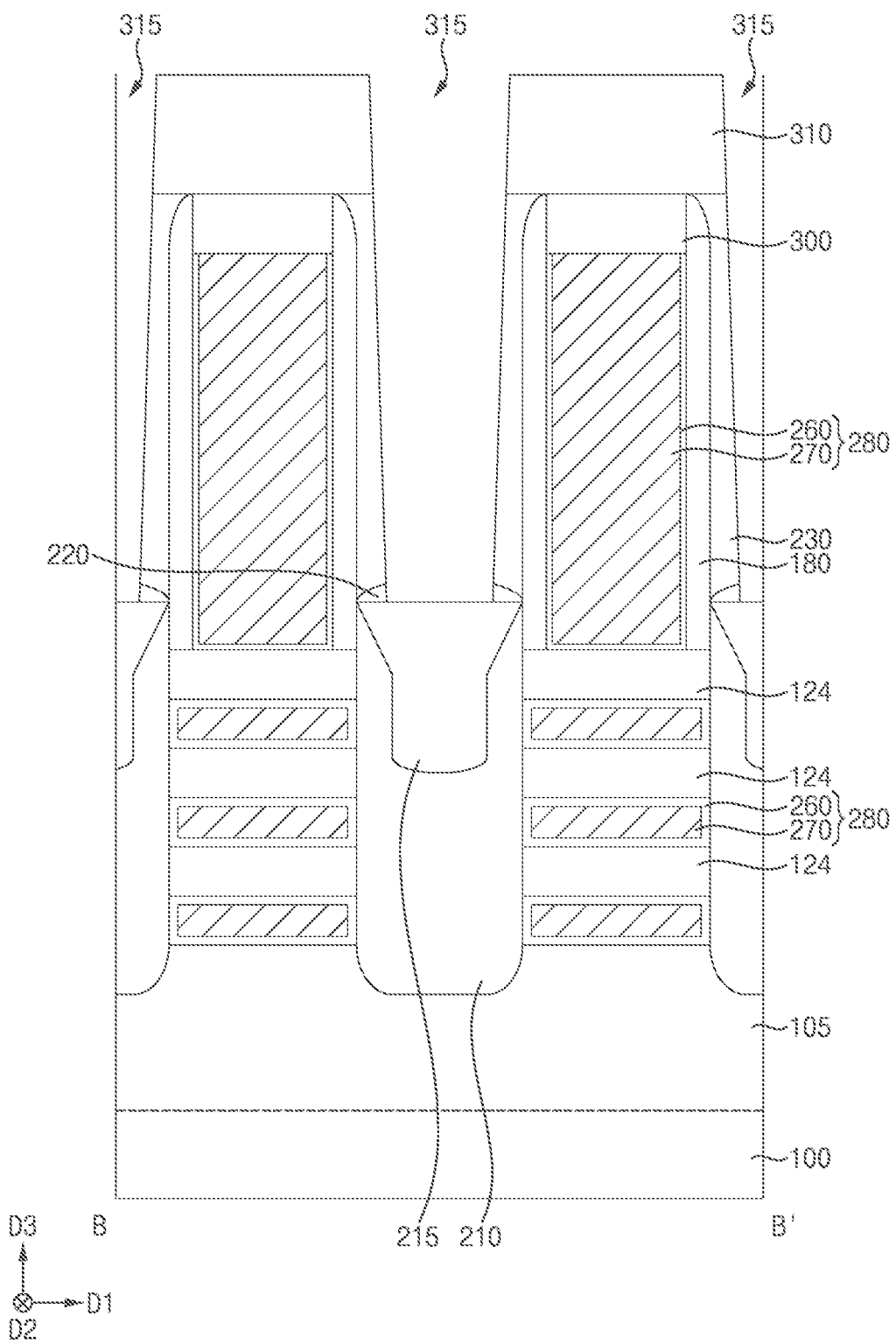
Figure 26:
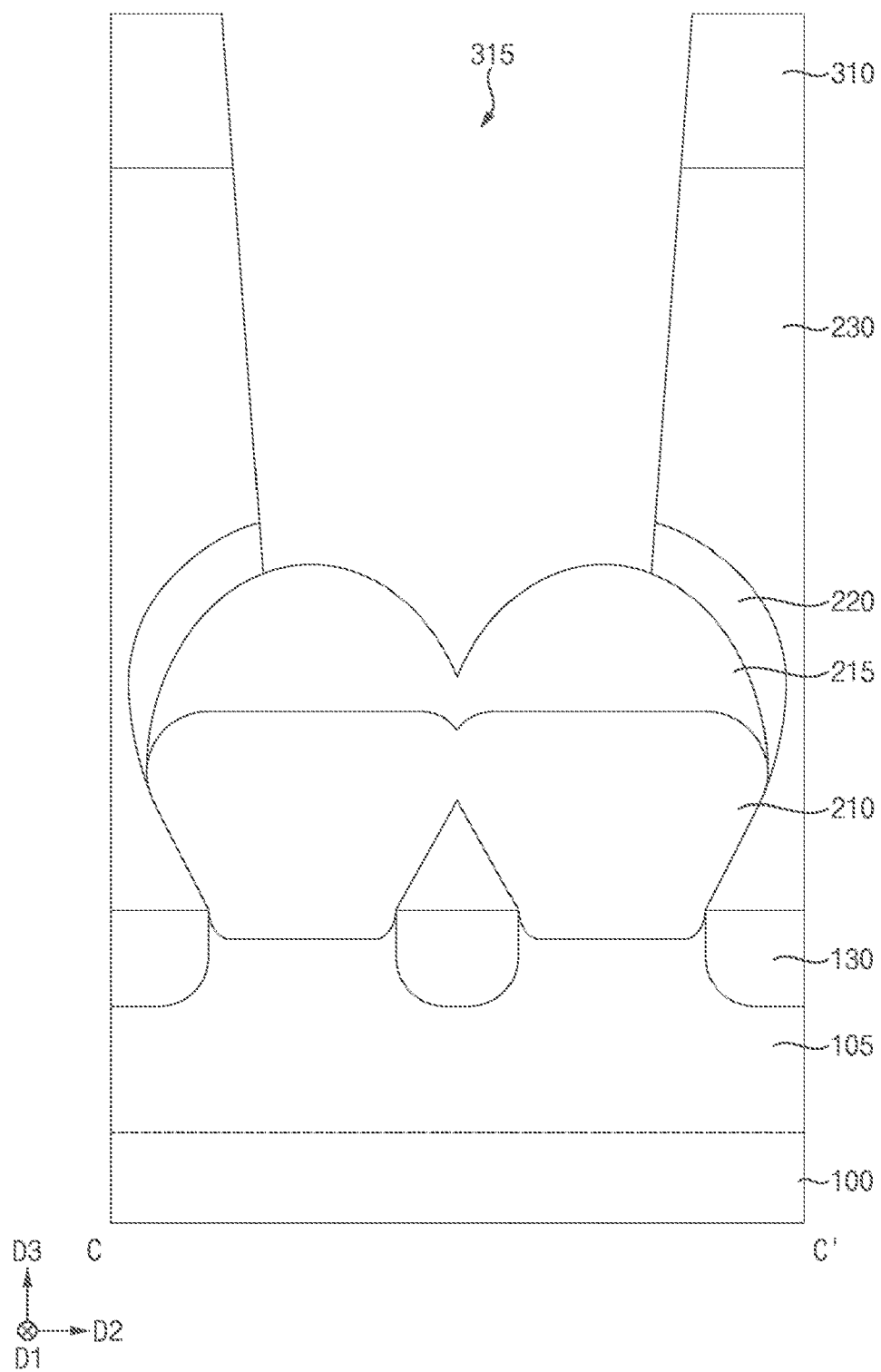

Referring to FIGS. 25 to 26, in an embodiment, an upper portion of the gate structure 280 is removed to form a recess, and a capping pattern 300 is formed in the recess.

A second insulating interlayer 310 is formed on the capping pattern 300, the gate spacer 180 and the first insulating interlayer 230, and portions of the first and second insulating interlayers 230 and 310 and a portion of the second epitaxial layer 220 are removed to form a fourth opening 315 that exposes the sacrificial epitaxial layer 215.

In embodiments, the first and second insulating interlayers 230 and 310 and the second epitaxial layer 220 are removed by, e.g., a wet etching process.

Figure 27:
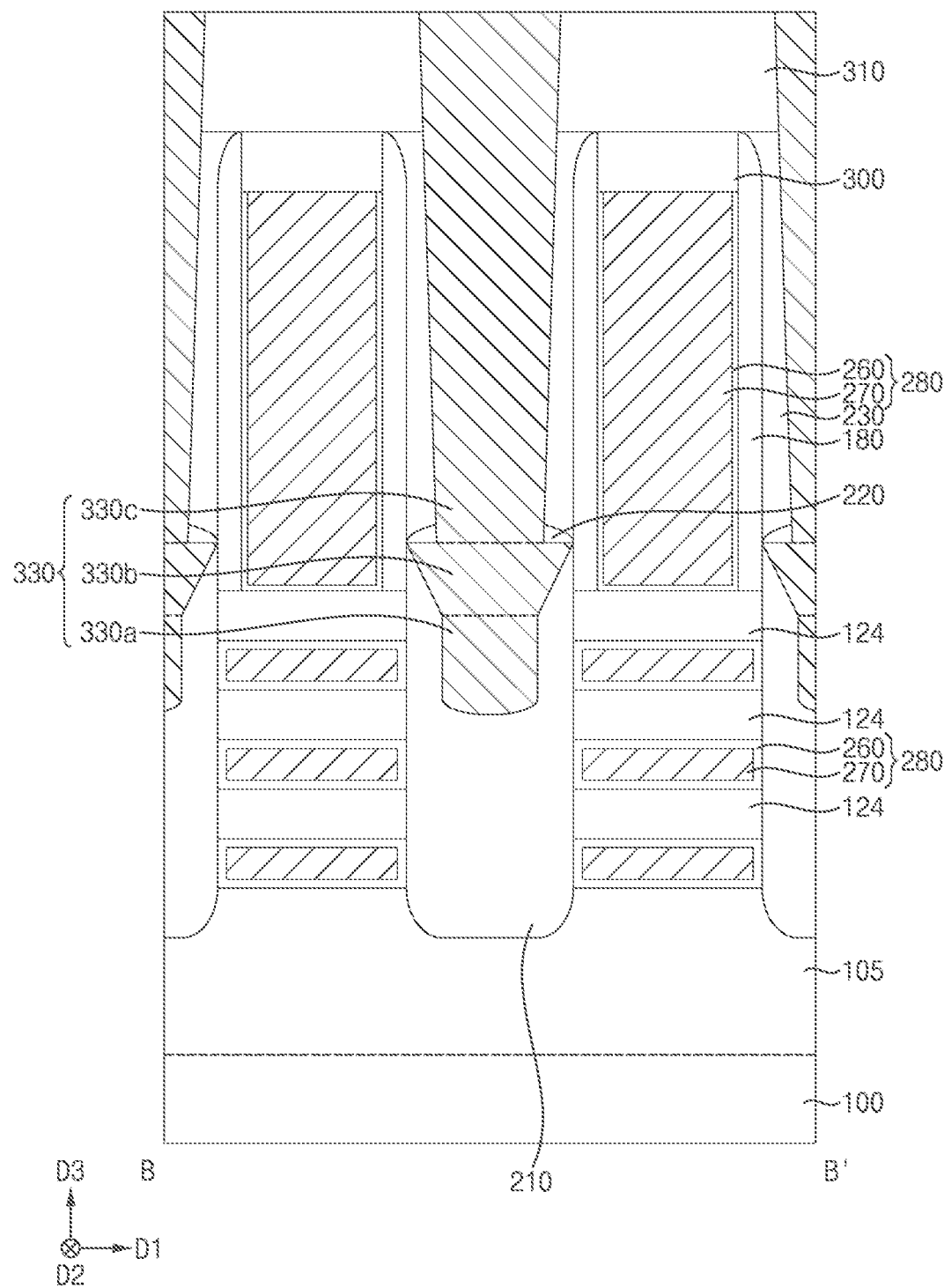
Figure 28:
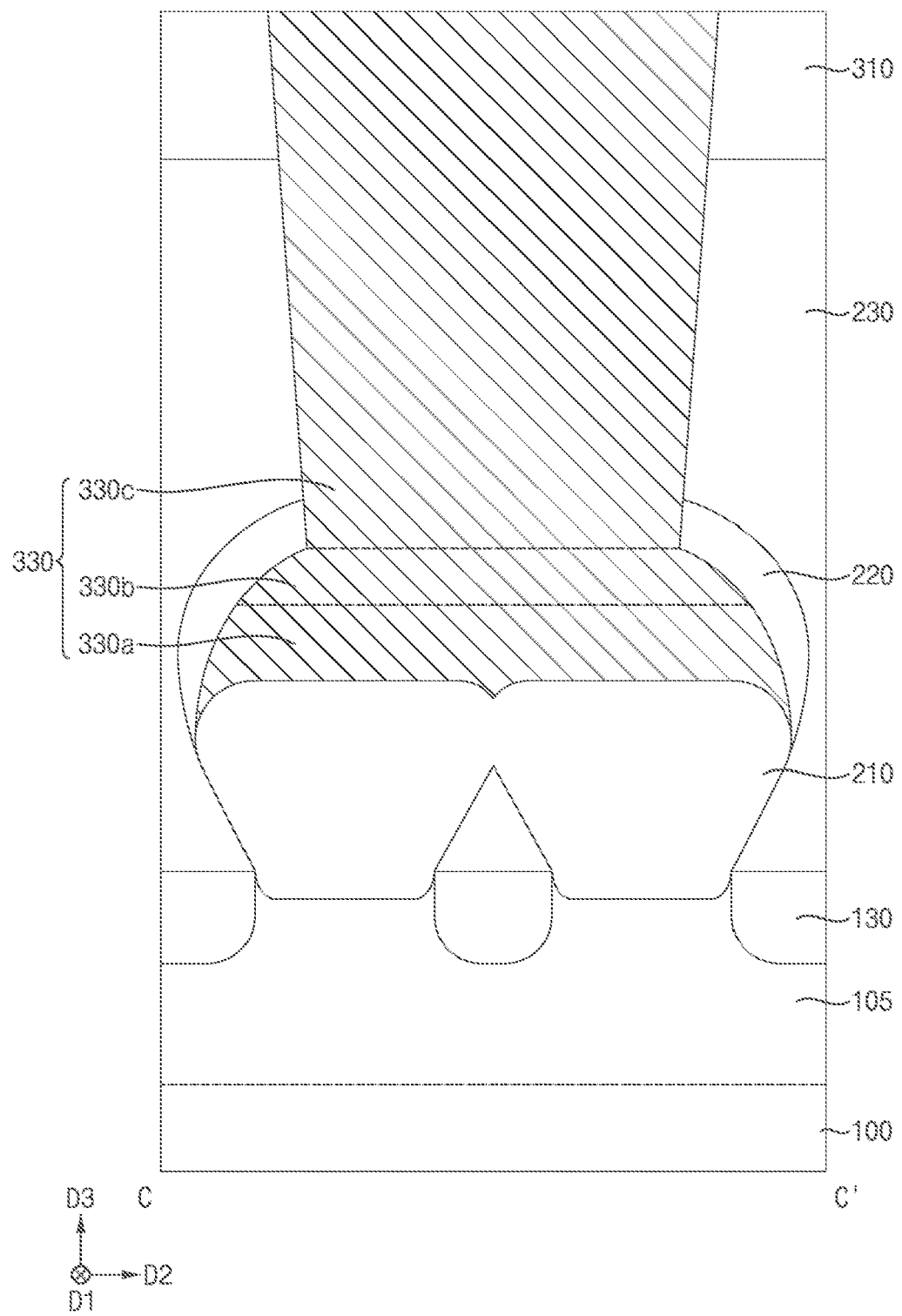

Referring to FIGS. 27 and 28, in an embodiment, the exposed sacrificial epitaxial layer 215 is removed.

The sacrificial epitaxial layer 215 is removed by, e.g., a wet etching process and/or a dry etching process. Accordingly, the fourth opening 315 is downwardly enlarged. The sacrificial epitaxial layer 215 includes a material, such as a single crystal germanium or a single crystal silicon-germanium, that has an etch selectivity with respect to a single crystal silicon or a single crystal silicon carbide in the first epitaxial layer 210, and thus the first epitaxial layer 210 is not removed during the etching process.

A first contact plug 330 is formed that fills the fourth opening 315.

In embodiments, the first contact plug 330 includes a lower portion 330a, a middle portion 330b and an upper portion 330c that are sequentially stacked in the third direction D3. The lower and middle portions 330a and 330b of the first contact plug 330 are formed in a portion of the fourth opening 315 enlarged by removing the sacrificial epitaxial layer 215, and the upper portion 330c of the first contact plug 330 is formed in a portion of the fourth opening 315 that was present before removing the sacrificial epitaxial layer 215.

Accordingly, the lower and middle portions 330a and 330b of the first contact plug 330 have substantially the same shape as the sacrificial epitaxial layer 215. The sacrificial epitaxial layer 215 is formed by the second SEG process, and the sacrificial epitaxial layer 215 is formed on the first epitaxial layer 210 that is formed by the first SEG process. Thus, the shape of the sacrificial epitaxial layer 215 can be adjusted through the first and second SEG processes, and the first contact plug 330 is formed to contact the first epitaxial layer 210 in a large area.

The first to third SEG processes are performed in-situ, and thus, when compared to forming an epitaxial layer by a single SEG process and a contact plug that contacts an upper surface of the epitaxial layer, the first contact plug 330 can be formed without significantly changing process conditions.

Referring to FIGS. 1 to 4 again, in an embodiment, a third insulating interlayer 340 is formed on the second insulating interlayer 310 and the first contact plug 330, and a second contact plug 350 is formed that extends through the second and third insulating interlayers 310 and 340 and the capping pattern 300 to contact an upper surface of the gate structure 280.

A via 370 is formed through the second and third insulating interlayers 310 and 340 and contacts an upper surface of the first contact plug 330.

Upper wirings are further formed on the first and second contact plugs 330 and 350 and the via 370 that complete a fabrication of a semiconductor device according to an embodiment.

As illustrated above, the first epitaxial layer 210, the sacrificial epitaxial layer 215 and the second epitaxial layer 220 are formed by performing the first to third SEG processes, respectively, the first and second insulating interlayers 230 and 310 are formed on the second epitaxial layer 220, the fourth opening 315 is formed through the first and second insulating interlayers 230 and 310 to expose the sacrificial epitaxial layer 215, and the exposed sacrificial epitaxial layer 215 is removed through the fourth opening 315 by an etching process.

The lower and middle portions 330a and 330b of the first contact plug 330 are formed in a portion of the fourth opening 314 enlarged by removing the sacrificial epitaxial layer 215. Accordingly, the shape of the lower and middle portions 330a and 330b of the first contact plug 330 depends on the shape of the first epitaxial layer 210 and the sacrificial epitaxial layer 215, and the first and second SEG processes can be adjusted so that the first contact plug 330 and the first epitaxial layer 210 contact in a large area.

The sacrificial epitaxial layer 215 includes a material that has an etch selectivity with the first epitaxial layer 210, and thus the first epitaxial layer 210 is not removed during the etching process that removes the sacrificial epitaxial layer 215.

Figure 29:
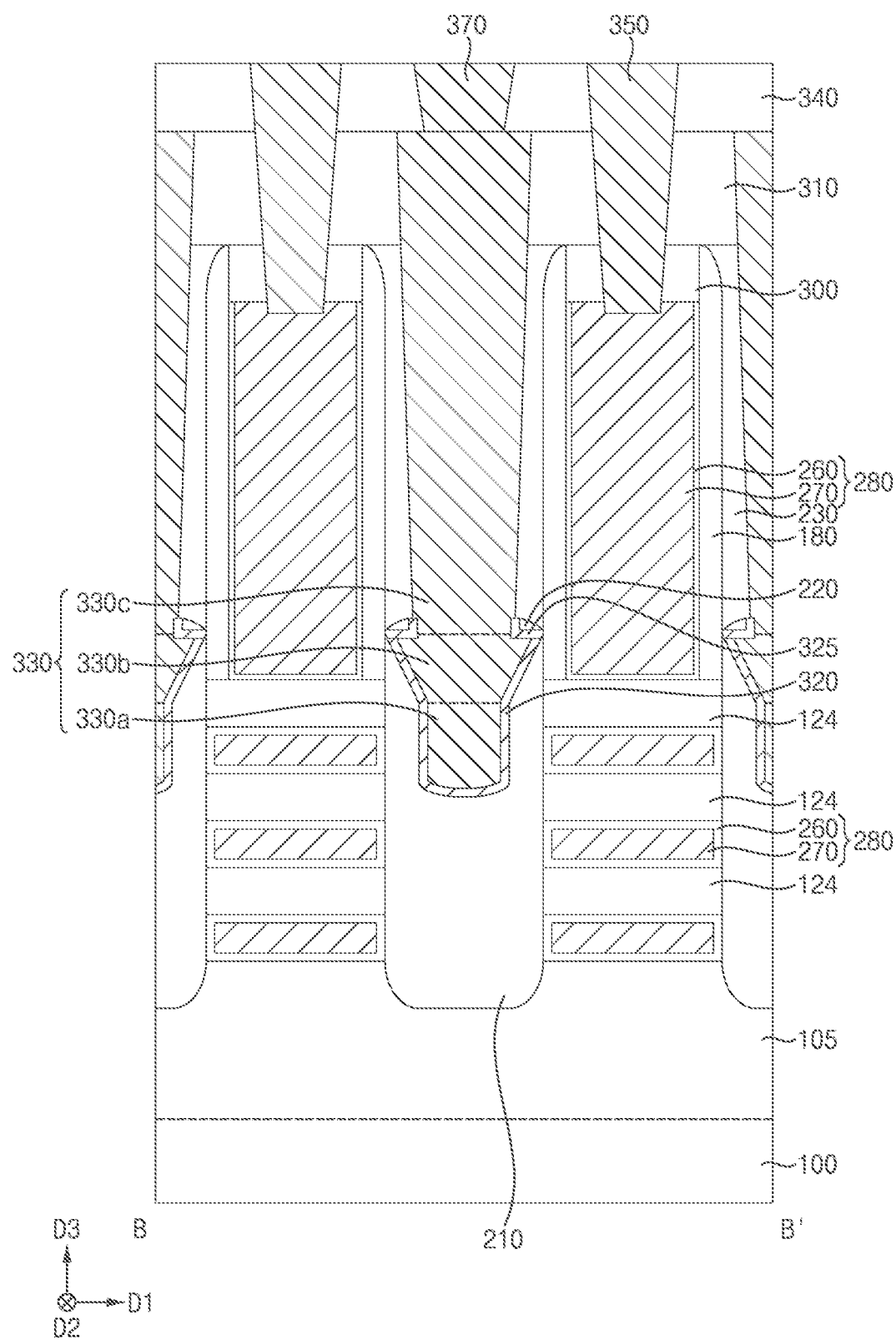
FIGS. 29 and 30 are cross-sectional views of semiconductor devices in accordance with embodiments.
Figure 30:
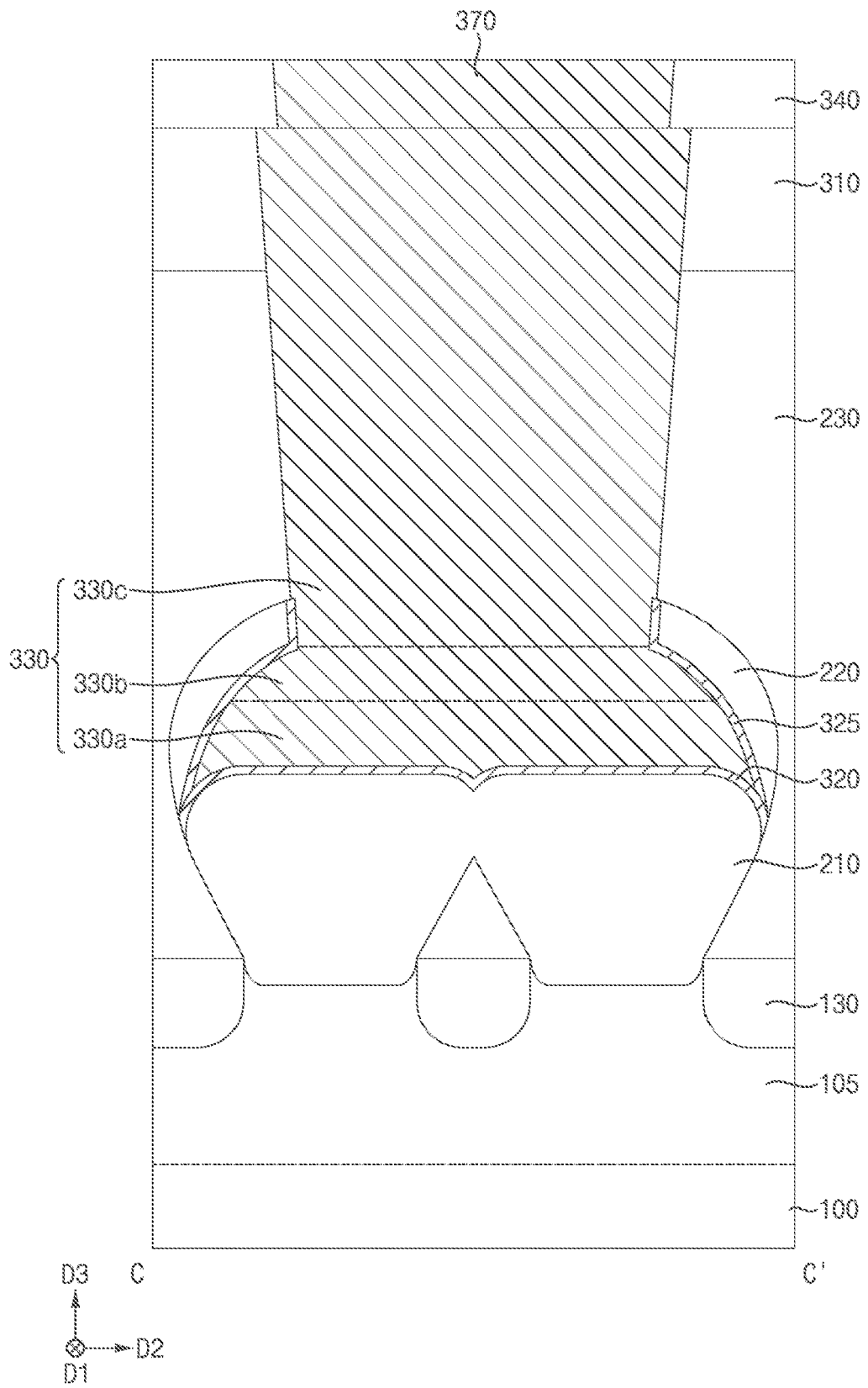

FIGS. 29 and 30 are cross-sectional views of a semiconductor device in accordance with embodiments that correspond to FIGS. 3 and 4, respectively.

A semiconductor device as shown in FIGS. 29 and 30 is substantially the same as or similar to that of FIGS. 1 to 4, except for further including first and second ohmic contact patterns 320 and 325, and thus repeated explanations are omitted herein.

Referring to FIGS. 29 to 30, in an embodiment, the first ohmic contact pattern 320 is formed between the first contact plug 330 and the first epitaxial layer 210, and the second ohmic contact pattern 325 is formed between the first contact plug 330 and the second epitaxial layer 220.

Each of the first and second ohmic contact patterns 320 and 325 includes, e.g., at least one of cobalt silicide, nickel silicide, or titanium silicide, etc.

Figure 31:
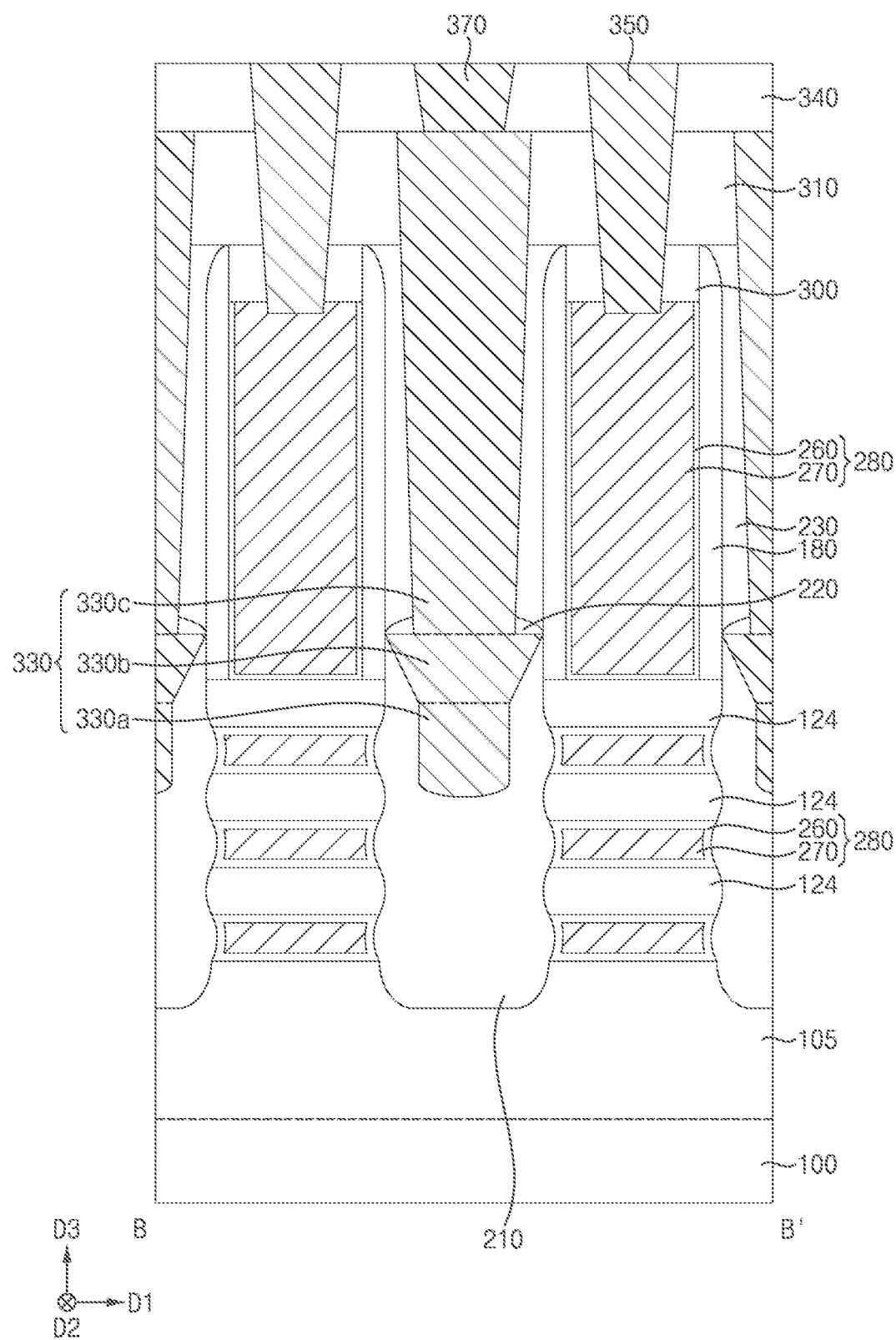
FIG. 31 is a cross-sectional view of a semiconductor device in accordance with embodiments.
Figure 32:
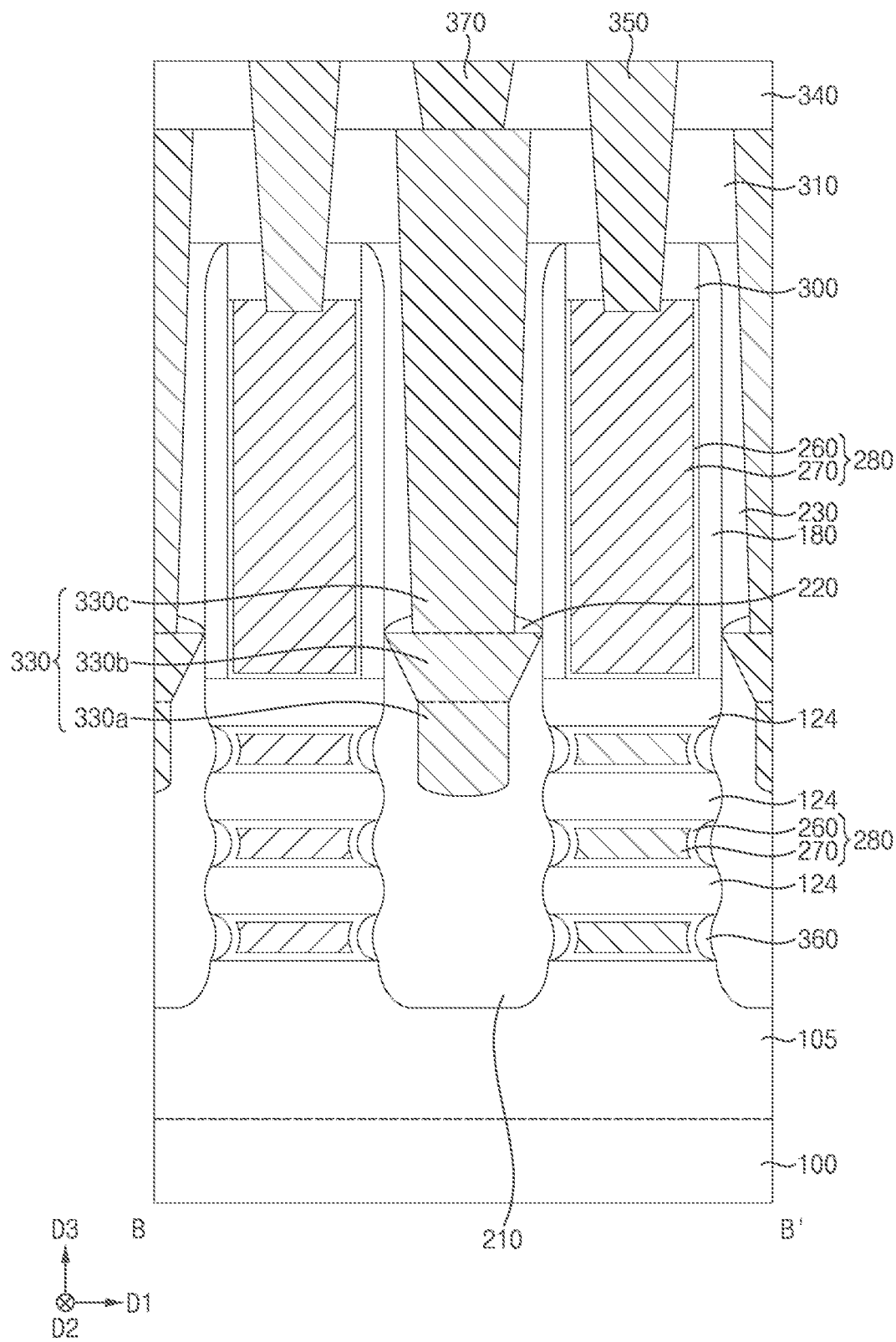
FIG. 32 is a cross-sectional view of a semiconductor device in accordance with embodiments.

FIGS. 31 and 32 are cross-sectional views of semiconductor devices in accordance with embodiments that correspond to FIGS. 3 and 4, respectively.

Semiconductor devices of FIGS. 31 and 32 are substantially the same as or similar to those of FIGS. 1 to 4, except for the shape of the first epitaxial layer 210, or further including an inner spacer 360, and thus repeated explanations are omitted herein.

Referring to FIG. 31, in an embodiment, a sidewall in the first direction D1 of the first epitaxial layer 210 is not substantially perpendicular to the upper surface of the substrate 100, but has varying slopes with respect to the upper surface of the substrate 100.

A width of the first epitaxial layer 210 in the first direction D1 changes along the third direction D3. For example, the width of the first epitaxial layer 210 periodically changes along the third direction D3. Thus, the sidewall of the first epitaxial layer 210 has a shape that oscillates in the first direction D1, and has concave portions and convex portions in the first direction D1 that are alternately and repeatedly disposed along the third direction D3. In embodiments, a width of the first epitaxial layer 210 that faces the semiconductor pattern 124 is less than a width of the first epitaxial layer 210 that faces the lower portion of the gate structure 280.

Referring to FIG. 32, in an embodiment, the inner spacer 360 is formed between the first epitaxial layer 210 and the lower portion of the gate structure 280.

In an embodiment, the inner spacer 360 has a convex shape that is curved toward the gate structure 280. The inner spacer 360 includes an insulating nitride, such as silicon nitride.

Figure 33:
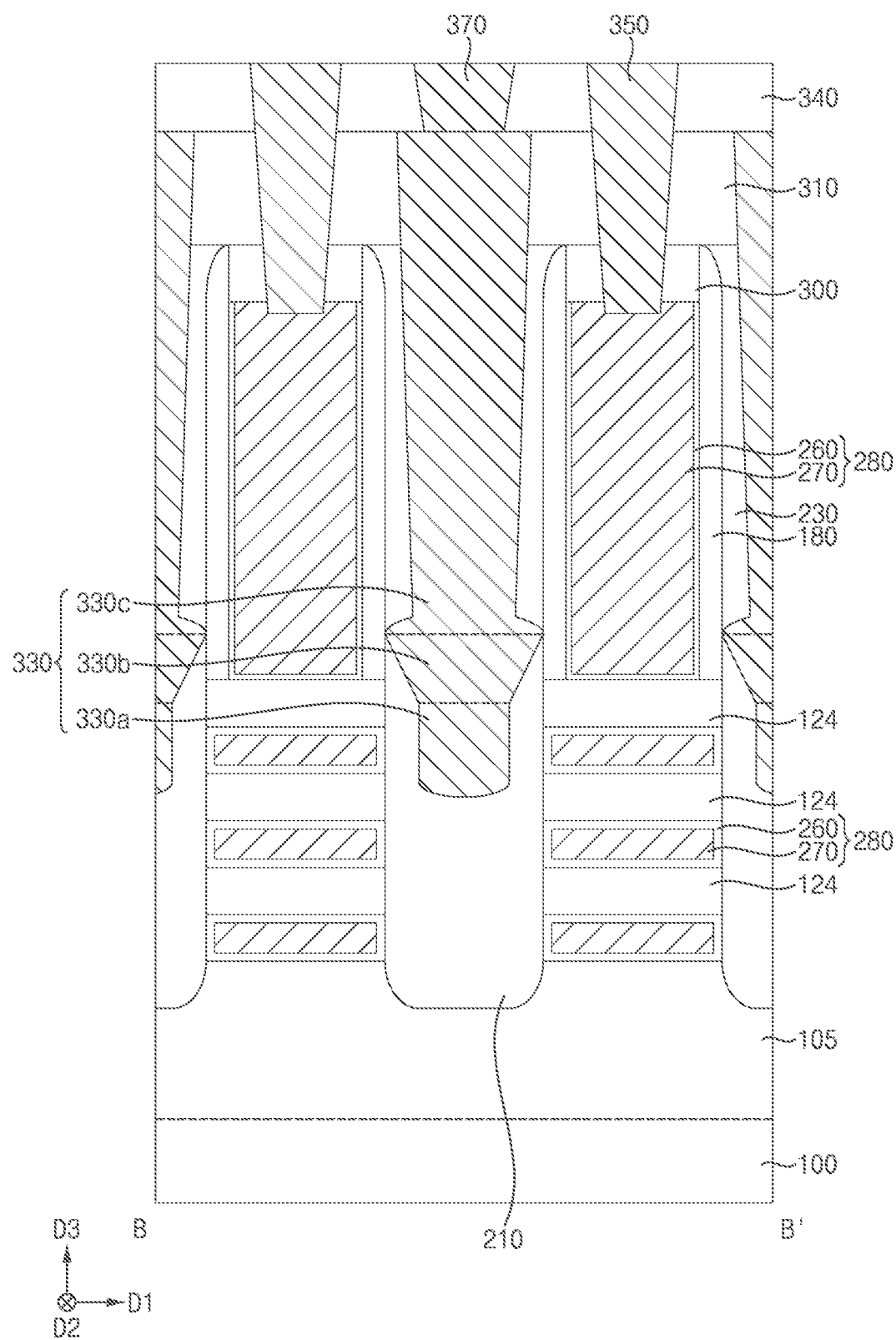
FIG. 33 is a cross-sectional view of a semiconductor device in accordance with embodiments.

FIG. 33 is a cross-sectional view of a semiconductor device in accordance with embodiments that corresponds to FIG. 3.

A semiconductor device of FIG. 33 is substantially the same as or similar to that of FIGS. 1 to 4, except for not including the second epitaxial layer 220, and the shape of the upper portion 330c of the first contact plug 330, and thus repeated explanations are omitted herein.

Referring to FIG. 33, in an embodiment, the upper surface of the middle portion 330b of the first contact plug 330 has an area that is substantially the same as an area of the lower surface of the upper portion 330c of the first contact plug 330.

A width in the first direction D1 of the upper portion 330c of the first contact plug 330 gradually decreases along the third direction D3 from a bottom portion to a given portion, and gradually increases along the third direction D3 from the given portion to a top portion thereof.

Figure 34:
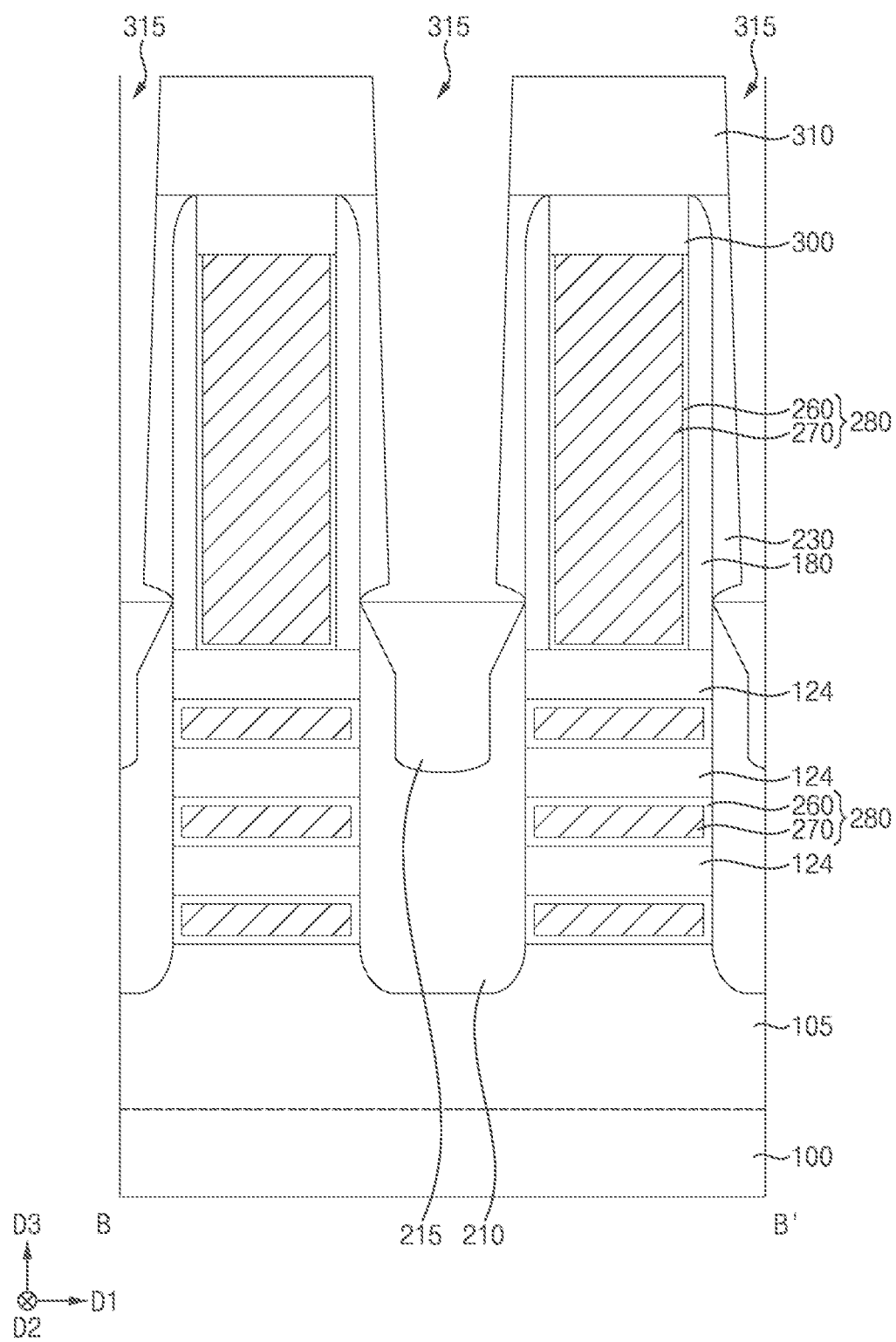
FIG. 34 is a cross-sectional view that illustrates a method of manufacturing a semiconductor device in accordance with embodiments.

FIG. 34 is a cross-sectional view that illustrates a method of manufacturing a semiconductor device in accordance with embodiments that corresponds to FIG. 25.

A method of FIG. 34 includes processes that are substantially the same as or similar to those illustrated with reference to FIGS. 5 to 28 and FIGS. 1 to 4, and thus repeated explanations thereof are omitted herein.

Processes that are substantially the same as or similar to those illustrated with reference to FIGS. 4 to 26 are performed.

However, unlike processes illustrated with reference to FIGS. 25 and 26, the second epitaxial layer 220 is removed by a wet etching process instead of the dry etching process, and thus the second epitaxial layer 220 is entirely removed.

Processes that are substantially the same as or similar to those illustrated with reference to FIGS. 27 to 28 are performed. Accordingly, the sacrificial epitaxial layer 215 is replaced with the lower portion 330a and the middle portion 330b of the first contact plug 330, and the second epitaxial layer 220 is replaced with a portion of the upper portion 330c of the first contact plug 330.

Processes that are substantially the same as or similar to those illustrated with reference to FIGS. 1 to 5 are performed to complete a fabrication of a semiconductor device according to an embodiment.

Figure 35:
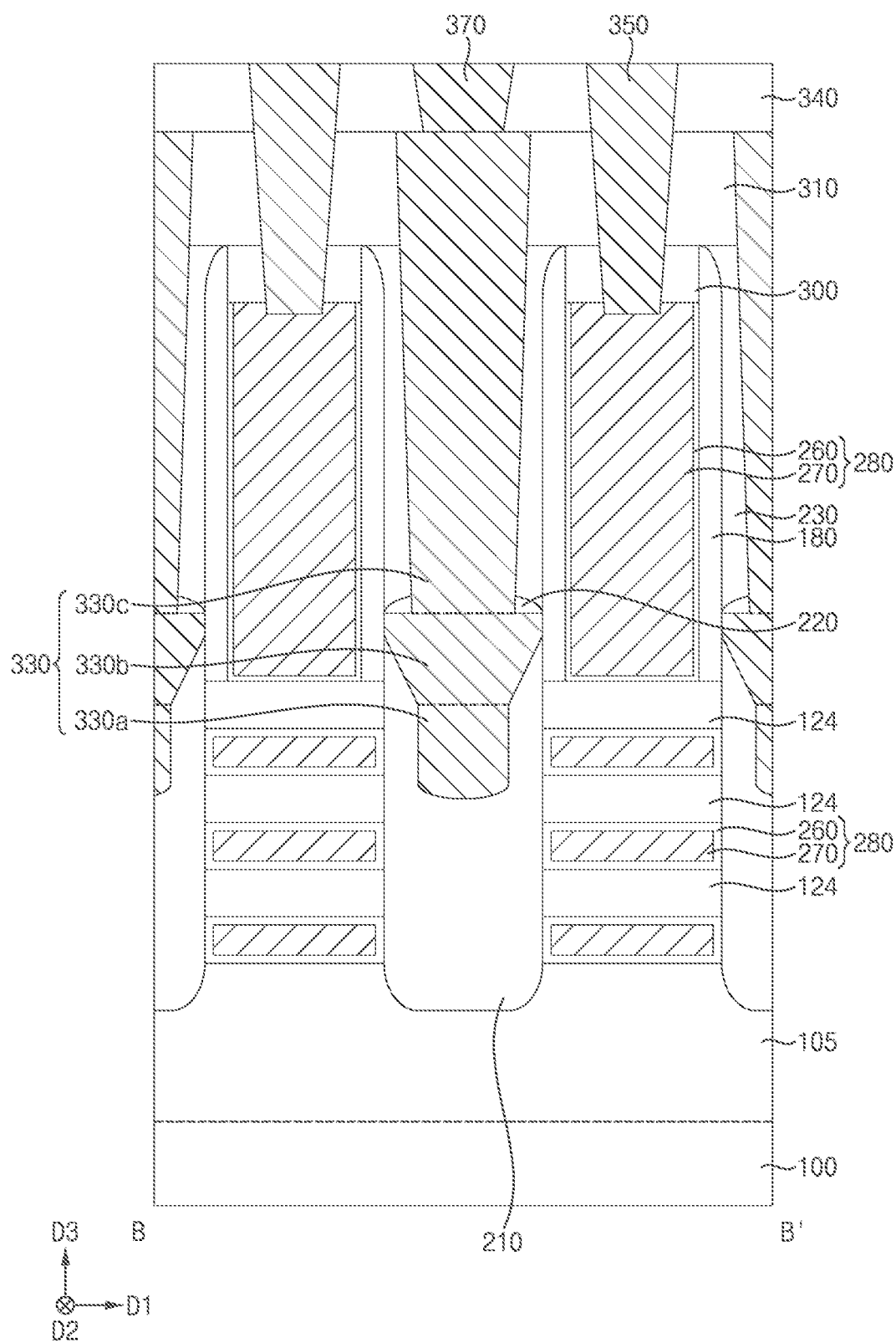
FIG. 35 is a cross-sectional view of a semiconductor device in accordance with embodiments.

FIG. 35 is a cross-sectional view illustrating a semiconductor device in accordance with embodiments that corresponds to FIG. 3.

A semiconductor device of FIG. 35 is substantially the same as or similar to that of FIGS. 1 to 4, except for the shape of the middle portion 330b of the first contact plug 330, and thus repeated explanations are omitted herein.

Referring to FIG. 35, in an embodiment, the upper surface of the middle portion 330b of the first contact plug 330 is higher than an uppermost surface of the first epitaxial layer 210, and an upper portion of a sidewall of the middle portion 330b of the first contact plug 330 is in contact with the outer sidewall in the first direction D1 of the gate spacer 180.

In embodiments, the width in the first direction D1 of the middle portion 330b of the first contact plug 330 gradually increases along the third direction D3 from a bottom portion to a give portion and remains substantially constant along the third direction D3 from the given portion to a top portion thereof. Accordingly, the sidewall in the first direction D1 of the middle portion 330b of the first contact plug 330 includes a first portion that is inclined with respect to the upper surface of the substrate and a second portion that is substantially perpendicular to the upper surface of the substrate 100.

Figure 36:
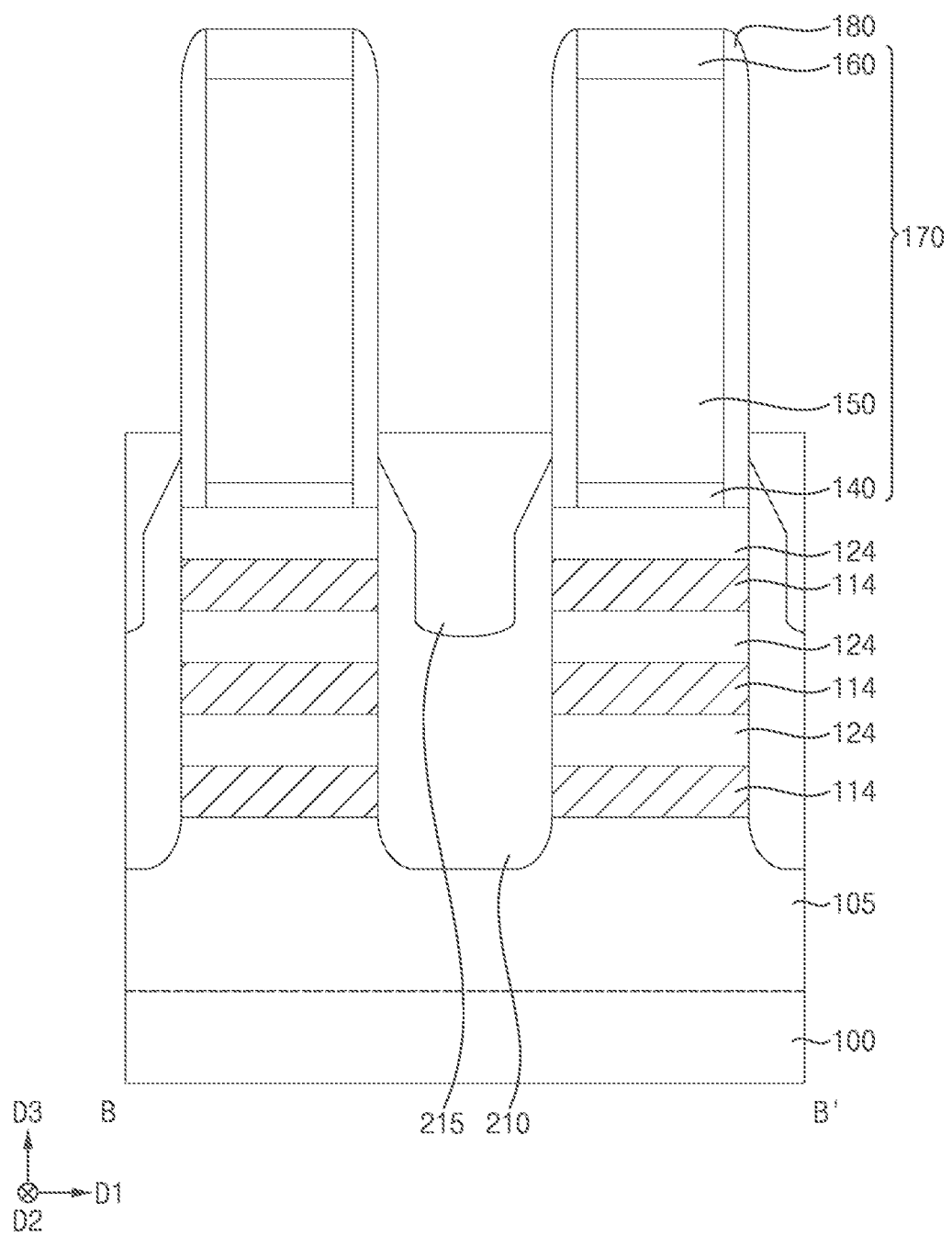
FIG. 36 is a cross-sectional view that illustrates a method of manufacturing a semiconductor device in accordance with embodiments.

FIG. 36 is a cross-sectional view that illustrates a method of manufacturing a semiconductor device in accordance with embodiments that corresponds to FIG. 17.

A method of FIG. 36 includes processes that are substantially the same as or similar to those illustrated with reference to FIGS. 5 to 28 and FIGS. 1 to 4, and thus repeated explanations thereof are omitted herein.

Processes that are substantially the same as or similar to those illustrated with reference to FIGS. 5 to 18 are performed.

However, unlike processes illustrated with reference to FIGS. 17 to 18, the uppermost surface of the sacrificial epitaxial layer 215 is higher than the uppermost surface of the first epitaxial layer 210.

Processes that are substantially the same as or similar to those illustrated with reference to FIGS. 19 to 28 and FIGS. 1 to 4 are performed to complete a fabrication of a semiconductor device according to an embodiment.

Figure 37:
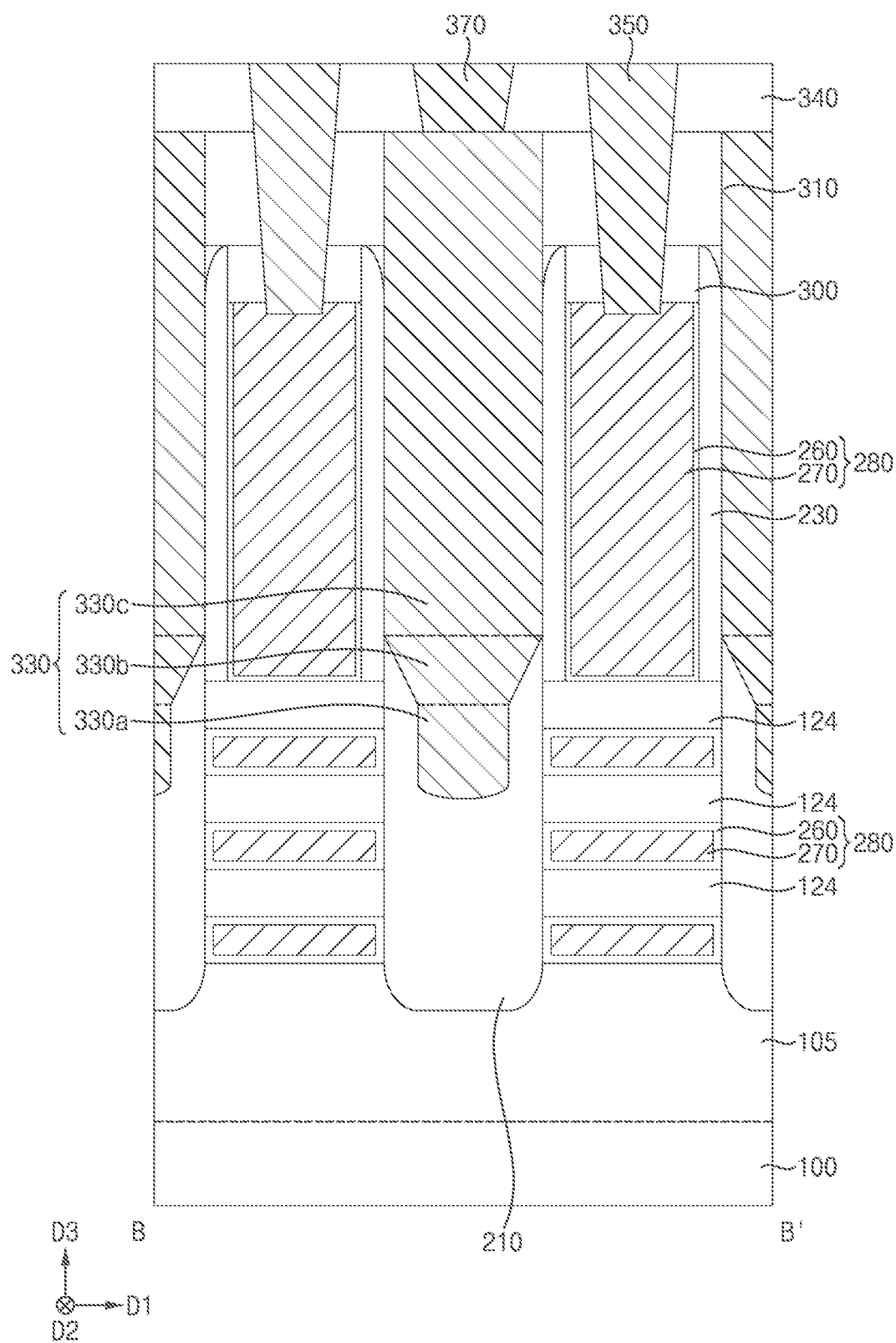
FIG. 37 is a cross-sectional view of a semiconductor device in accordance with embodiments.

FIG. 37 is a cross-sectional view of a semiconductor device in accordance with embodiments that corresponds to FIG. 3.

A semiconductor device of FIG. 37 is substantially the same as or similar to that of FIGS. 1 to 4, except for the shape of the upper portion 330c of the first contact plug 330, and thus repeated explanations are omitted herein.

Referring to FIG. 37, in an embodiment, the first contact plug 330 is self-aligned with the gate spacer 180, and thus a sidewall of the upper portion 330c of the first contact plug 330 contacts the outer sidewall in the first direction D1 of the gate spacer 180.

Figure 38:
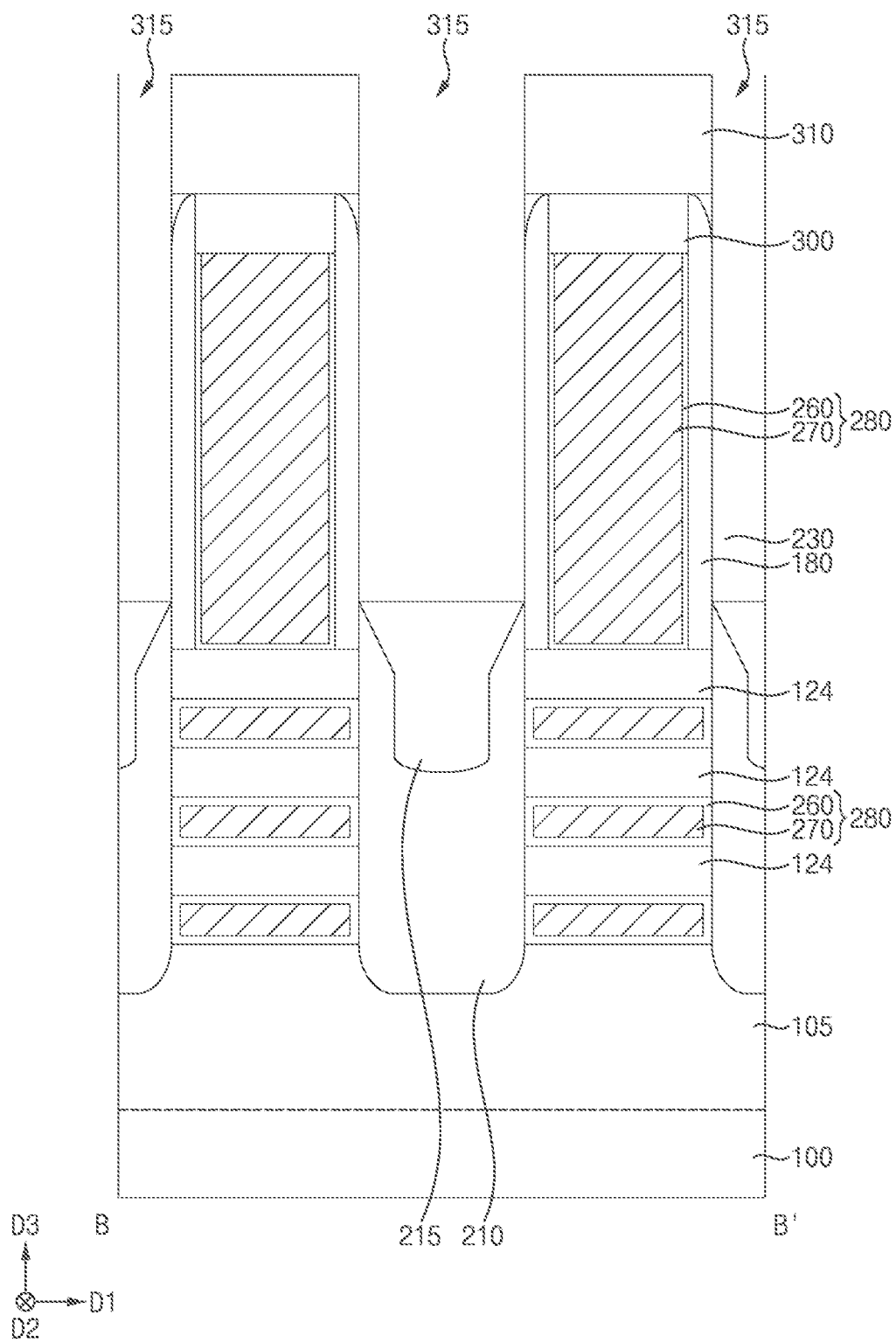
FIG. 38 is a cross-sectional view that illustrates a method of manufacturing a semiconductor device in accordance with embodiments.

FIG. 38 is a cross-sectional view that illustrates a method of manufacturing a semiconductor device in accordance with embodiments that corresponds to FIG. 25.

A method of FIG. 38 includes processes that are substantially the same as or similar to those illustrated with reference to FIGS. 5 to 28 and FIGS. 1 to 4, and thus repeated explanations thereof are omitted herein.

Processes that are substantially the same as or similar to those illustrated with reference to FIGS. 5 to 26 are performed.

However, in an embodiment, unlike processes illustrated with reference to FIGS. 25 to 26, when removing the first and second insulating interlayers 230 and 310 and the second epitaxial layer 220 to form the fourth opening 315, the first insulating interlayer 230 and the second epitaxial layer 220 between the gate spacers 180, which are formed on the sidewalls of the gate structures 280 adjacent to and facing each other in the first direction D1, are entirely removed.

Processes that are substantially the same as or similar to those illustrated with reference to FIGS. 27 to 28 and FIGS. 1 to 4 are performed to complete a fabrication of a semiconductor device according to an embodiment.

The foregoing is illustrative of embodiments and is not to be construed as limiting thereof. Although a few embodiments have been described, those skilled in the art will readily appreciate that many modifications are possible in the embodiments without materially departing from the novel teachings and advantages of embodiments of the present inventive concept. Therefore, it is to be understood that the foregoing is illustrative of various embodiments and is not to be construed as limited to specific disclosed embodiments, and that modifications to the disclosed embodiments, as well as other embodiments, are intended to be included within the scope of the appended claims.

What is claimed is:

1. A semiconductor device, comprising:
   an active pattern disposed on a substrate;
   a gate structure disposed on the active pattern;
   channels disposed on the substrate, where the channels are spaced apart from each other in a vertical direction that is substantially perpendicular to an upper surface of the substrate;
   a first epitaxial layer disposed on a portion of the active pattern adjacent to the gate structure; and
   a contact plug disposed on the first epitaxial layer, wherein the contact plug includes:
      a lower portion;
      a middle portion disposed on the lower portion, wherein the middle portion has a width that increases monotonically along the vertical direction from a bottom to a top thereof; and
      an upper portion disposed on the middle portion,
   wherein a width in the first direction of the lower portion of the contact plug is substantially constant in the vertical direction, and
   wherein a width of an upper surface of the middle portion of the contact plug is greater than a width of a lower surface of the upper portion of the contact plug, and a width of the lower surface of the middle portion of the contact plug is substantially same as a width of the upper surface of the lower portion of the contact plug.

2. The semiconductor device as claimed in claim 1, wherein an upper surface of the middle portion of the contact plug is substantially coplanar with an uppermost surface of the first epitaxial layer.

3. The semiconductor device as claimed in claim 2, wherein a width of the upper surface of the middle portion of the contact plug is substantially the equal to a width of a lower surface of the upper portion of the contact plug.

4. The semiconductor device as claimed in claim 1, wherein:
   the active pattern extends in a first direction substantially parallel to the upper surface of the substrate,
   the gate structure extends in a second direction substantially parallel to the upper surface of the substrate and that crosses the first direction,
   the first epitaxial layer is formed on the portion of the active pattern adjacent to the gate structure in the first direction, and
   the width in the first direction of the middle portion of the contact plug increases from the bottom to the top thereof along the vertical direction.

5. The semiconductor device as claimed in claim 1, wherein a width of an upper surface of the middle portion of the contact plug is greater than a width of a lower surface of the upper portion of the contact plug.

6. The semiconductor device as claimed in claim 5, further comprising a second epitaxial layer disposed on the first epitaxial layer, wherein the second epitaxial layer contacts a sidewall of the upper portion of the contact plug.

7. The semiconductor device as claimed in claim 6, wherein the second epitaxial layer includes one of silicon or silicon doped with p-type impurities.

8. The semiconductor device as claimed in claim 6, further comprising:
   a first ohmic contact pattern interposed between the contact plug and the first epitaxial layer; and
   a second ohmic contact pattern interposed between the contact plug and the second epitaxial layer.

9. The semiconductor device as claimed in claim 1, wherein the first epitaxial layer includes silicon doped with n-type impurities.

10. A semiconductor device, comprising:
    an active pattern disposed on a substrate;
    a gate structure disposed on the active pattern;
    channels disposed on the substrate, where the channels are spaced apart from each other in a vertical direction that is substantially perpendicular to the upper surface of the substrate;
    a first epitaxial layer disposed on a portion of the active pattern adjacent to the gate structure;
    a contact plug that includes:
       a lower portion and a middle portion sequentially stacked in the vertical direction, wherein the lower portion and the middle portion extend through an upper portion of the first epitaxial layer; and
       an upper portion disposed on the middle portion, wherein the upper portion extends in the vertical direction; and
    a second epitaxial layer disposed on the middle portion of the contact plug, wherein the second epitaxial layer contacts a portion of a sidewall of the upper portion of the contact plug,
    wherein the middle portion has a width that increases monotonically along the vertical direction from a bottom to a top thereof,
    wherein a width in the first direction of the lower portion of the contact plug is substantially constant in the vertical direction, and
    wherein a width of an upper surface of the middle portion of the contact plug is greater than a width of a lower surface of the upper portion of the contact plug, and a width of the lower surface of the middle portion of the contact plug is substantially same as a width of the upper surface of the lower portion of the contact plug.

11. The semiconductor device as claimed in claim 10, wherein the first epitaxial layer includes silicon doped with n-type impurities.

12. The semiconductor device as claimed in claim 10, wherein the second epitaxial layer includes one of silicon or silicon doped with p-type impurities.

13. The semiconductor device as claimed in claim 10, wherein a width of an upper surface of the middle portion of the contact plug is greater than a width of a lower surface of the upper portion of the contact plug.

14. The semiconductor device as claimed in claim 10, further comprising:
    a first ohmic contact pattern interposed between the first epitaxial layer, and each of the lower portion and the middle portion of the contact plug; and
    a second ohmic contact pattern interposed between the second epitaxial layer and the upper portion of the contact plug.

15. The semiconductor device as claimed in claim 10, wherein:
    the active pattern extends in a first direction substantially parallel to the upper surface of the substrate,
    the gate structure extends in a second direction substantially parallel to the upper surface of the substrate and that crosses the first direction,
    the first epitaxial layer is formed on the portion of the active pattern adjacent to the gate structure in the first direction,
    a width in the first direction of the middle portion of the contact plug increases from a bottom to a top thereof along the vertical direction, and a width in the first direction of the lower portion of the contact plug increases from a bottom to a top thereof along the vertical direction.

16. The semiconductor device as claimed in claim 10, wherein an upper surface of the second epitaxial layer has an upwardly curved convex shape.

17. A semiconductor device, comprising:
an active pattern disposed on a substrate, wherein the active pattern extends in a first direction that is substantially parallel to an upper surface of the substrate;
a gate structure on the active pattern, wherein the gate structure extends in a second direction that is substantially parallel to the upper surface of the substrate and crosses the first direction;
channels disposed on the active pattern and that are spaced apart from each other in a third direction that is substantially perpendicular to the upper surface of the substrate;
a first epitaxial layer disposed on a portion of the active pattern adjacent in the first direction to the gate structure, wherein the first epitaxial layer includes silicon doped with n-type impurities;
a contact plug disposed on the first epitaxial layer, wherein the contact plug includes:
a lower portion;
a middle portion disposed on the lower portion, wherein the middle portion has a width in the first direction that increases monotonically from a bottom to a top thereof along the vertical direction; and
a upper portion disposed on the middle portion; and
a second epitaxial layer on the middle portion of the contact plug, the second epitaxial layer contacting a portion of a sidewall in the first direction of the upper portion of the contact plug and including silicon or silicon doped with p-type impurities,
wherein a width in the first direction of the lower portion of the contact plug is substantially constant in the vertical direction, and
wherein a width of an upper surface of the middle portion of the contact plug is greater than a width of a lower surface of the upper portion of the contact plug, and a width of the lower surface of the middle portion of the contact plug is substantially same as a width of the upper surface of the lower portion of the contact plug.

18. The semiconductor device as claimed in claim 17, wherein an upper surface of the middle portion of the contact plug is substantially coplanar with an uppermost surface of the first epitaxial layer.

19. The semiconductor device as claimed in claim 17, wherein a width of an upper surface of the middle portion of the contact plug is greater than a width of a lower surface of the upper portion of the contact plug.

20. The semiconductor device as claimed in claim 17, further comprising:
a first ohmic contact pattern interposed between the contact plug and the first epitaxial layer; and
a second ohmic contact pattern interposed between the contact plug and the second epitaxial layer.

* * * * *